US012796056B2

(12) United States Patent
Huang et al.

(10) Patent No.: US 12,796,056 B2
(45) Date of Patent: Nov. 10, 2026

(54) CONTACT FORMATION METHOD AND RELATED STRUCTURE

(71) Applicant: Taiwan Semiconductor Manufacturing Co., Ltd., Hsinchu (TW)

(72) Inventors: Lin-Yu Huang, Hsinchu (TW); Li-Zhen Yu, New Taipei City (TW); Chia-Hao Chang, Hsinchu City (TW); Cheng-Chi Chuang, New Taipei City (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 526 days.

(21) Appl. No.: 18/335,741

(22) Filed: Jun. 15, 2023

(65) Prior Publication Data

US 2023/0326986 A1 Oct. 12, 2023

Related U.S. Application Data

(62) Division of application No. 16/948,745, filed on Sep. 30, 2020, now Pat. No. 11,682,707.

(Continued)

(51) Int. Cl.

| | |
|---|---|
| ***H10D 64/23*** | (2025.01) |
| ***H10D 30/62*** | (2025.01) |

(Continued)

(52) U.S. Cl.

CPC .......... *H10D 64/258* (2025.01); *H10D 30/62* (2025.01); *H10D 64/01324* (2026.01);

(Continued)

(58) Field of Classification Search

CPC .......... H10D 64/01324; H10D 64/015; H10D 64/017; H10D 64/021; H10D 64/518;

(Continued)

(56) References Cited

U.S. PATENT DOCUMENTS

| | | | |
|---|---|---|---|
| 6,486,067 | B1 | 11/2002 | Shen |
| 8,035,165 | B2 | 10/2011 | Yeh |

(Continued)

FOREIGN PATENT DOCUMENTS

| | | | |
|---|---|---|---|
| TW | 201937608 | A | 9/2019 |
| TW | 202006805 | A | 2/2020 |

*Primary Examiner* — Marcos D. Pizarro

(74) *Attorney, Agent, or Firm* — HAYNES AND BOONE, LLP

(57) ABSTRACT

A semiconductor device includes a metal gate structure having sidewall spacers disposed on sidewalls of the metal gate structure. In some embodiments, a top surface of the metal gate structure is recessed with respect to a top surface of the sidewall spacers. The semiconductor device may further include a metal cap layer disposed over and in contact with the metal gate structure, where a first width of a bottom portion of the metal cap layer is greater than a second width of a top portion of the metal cap layer. In some embodiments, the semiconductor device may further include a dielectric material disposed on either side of the metal cap layer, where the sidewall spacers and a portion of the metal gate structure are disposed beneath the dielectric material.

20 Claims, 20 Drawing Sheets

Related U.S. Application Data

(60) Provisional application No. 63/002,781, filed on Mar. 31, 2020.

(51) Int. Cl.

| | |
|---|---|
| ***H10D 64/01*** | (2025.01) |
| ***H10D 64/27*** | (2025.01) |
| ***H10D 64/66*** | (2025.01) |
| ***H10D 64/68*** | (2025.01) |
| ***H10D 84/01*** | (2026.01) |
| ***H10D 84/03*** | (2025.01) |
| ***H10W 20/00*** | (2026.01) |

(52) U.S. Cl.

CPC ......... *H10D 64/015* (2025.01); *H10D 64/017* (2025.01); *H10D 64/021* (2025.01); *H10D 64/254* (2025.01); *H10D 64/518* (2025.01); *H10D 64/666* (2025.01); *H10D 84/0147* (2025.01); *H10D 84/0149* (2025.01); *H10D 84/038* (2025.01); *H10W 20/063* (2026.01); *H10W 20/0633* (2026.01); *H10W 20/069* (2026.01); *H10W 20/0693* (2026.01); *H10D 64/691* (2025.01)

(58) Field of Classification Search

CPC ............. H10D 64/666; H10D 84/0149; H10D 84/038; H10D 30/62; H10D 64/018; H10D 30/501–504; H10D 30/506–509; H10W 20/039; H10W 20/063; H10W 20/0633; H10W 20/069; H10W 20/0693

See application file for complete search history.

(56) References Cited

U.S. PATENT DOCUMENTS

| | | | | |
|---|---|---|---|---|
| 8,981,496 | B2 | 3/2015 | Liu | |
| 9,331,179 | B2 | 5/2016 | Liu | |
| 9,368,603 | B2 | 6/2016 | Chuang | |
| 9,385,069 | B2 | 7/2016 | Liu | |
| 9,761,677 | B2 | 9/2017 | Liu | |
| 2011/0156107 | A1 | 6/2011 | Bohr | |
| 2014/0042502 | A1 | 2/2014 | Xie | |
| 2014/0231885 | A1* | 8/2014 | Xie | H10D 30/021 438/585 |
| 2016/0365309 | A1 | 12/2016 | Zhang | |
| 2018/0308751 | A1 | 10/2018 | Wang | |
| 2019/0165123 | A1 | 5/2019 | Lo | |
| 2020/0098922 | A1* | 3/2020 | You | H10D 30/0243 |

* cited by examiner

CONTACT FORMATION METHOD AND RELATED STRUCTURE

CROSS-REFERENCE TO RELATED APPLICATION

This application is a divisional of U.S. patent application Ser. No. 16/948,745, filed Sep. 30, 2020, issuing as U.S. Pat. No. 11,682,707, which claims the benefit of U.S. Provisional Application No. 63/002,781, filed Mar. 31, 2020, the entireties of which are incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, forming a reliable contact to a metal gate electrode requires a reliable and low resistance metal gate via. However, as IC device scaling continues, a bottom dimension of a metal gate via (e.g., width of the metal gate via at the bottom of the metal gate via) becomes smaller and resistance at an interface between the metal gate via and the underlying metal gate electrode becomes more dominant. As a result, device performance (e.g., device speed) is degraded. In addition, metal gate via etching and metal gap fill capabilities become much more difficult due to the highly-scaled metal gate via. In at least some cases, this could lead to premature stoppage of a metal gate via etching process (e.g., resulting in incomplete formation of the metal gate via) or cause a serious void in the metal gate via and degrade device performance. In some cases, a glue layer disposed along a sidewall of the metal gate via may also seriously degrade device performance due to a high resistance of the glue layer. This problem becomes more pronounced as device dimensions continue to shrink.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
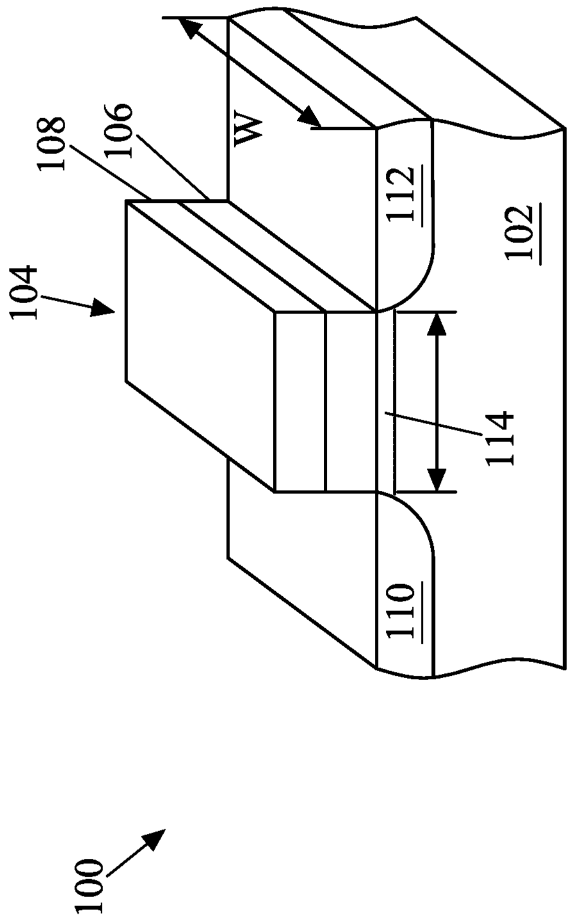
FIG. 1A is a cross-sectional view of an MOS transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In various examples, thicknesses, widths, heights, or other dimensions that are described as being the same, substantially the same, or equal to each other may be at least within 10% of each other.

It is also noted that the present disclosure presents embodiments in the form of metal gate vias which may be employed in any of a variety of device types. For example, embodiments of the present disclosure may be used to form metal gate vias in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, or other devices as known in the art. In addition, embodiments disclosed herein may be employed in the formation of P-type and/or N-type devices. One of ordinary skill may recognize other embodiments of semiconductor devices that may benefit from aspects of the present disclosure.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 106. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-K dielectric layer such as hafnium oxide ($HfO_2$). Alternatively, the high-K dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), CVD, oxidation, and/or other suitable methods. In some embodiments, the gate electrode 108 may be deposited as part of a gate first or gate last (e.g., replacement gate) process. In various embodiments, the gate electrode 108 includes a conductive layer such as W, Ti, TiN, TiAl, TiAlN, Ta, TaN, WN, Re, Ir, Ru, Mo, Al, Cu, Co, TiSi, CoSi, Ni, NiSi, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 108 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some cases, the gate stack 104 may also include one or more barrier layers, filler layers, and/or other appropriate layers. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown source/drain regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2/V\text{-}s$ and an intrinsic hole mobility at room temperature (300 K) of around 480 $cm^2/V\text{-}s$.

Figure 1B:
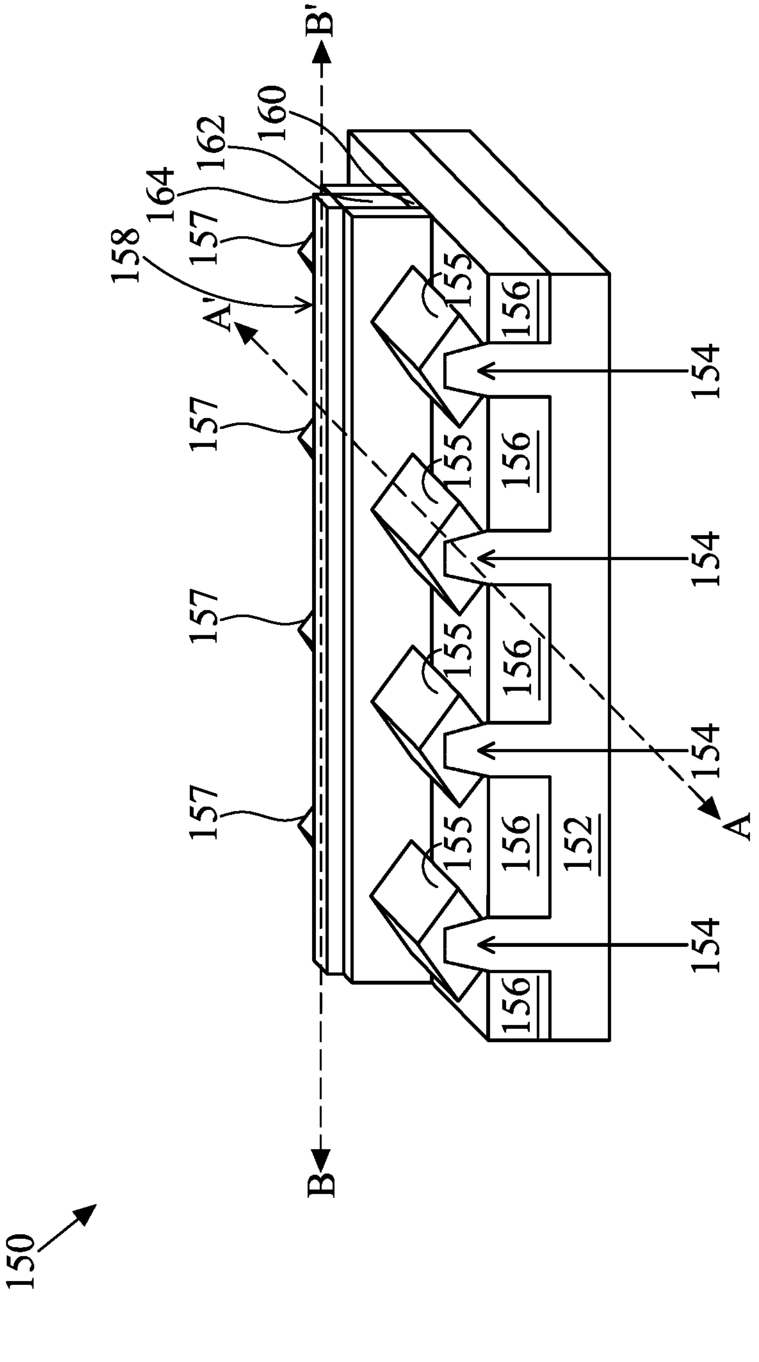
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 150 includes one or more fin-based, multi-gate field-effect transistors (FETs). The FinFET device 150 includes a substrate 152, at least one fin element 154 extending from the substrate 152, isolation regions 156, and a gate structure 158 disposed on and around the fin element 154. The substrate 152 may be a semiconductor substrate such as a silicon substrate. In various embodiments, the substrate 152 may be substantially the same as the substrate 102 and may include one or more of the materials used for the substrate 102, as described above.

The fin element 154, like the substrate 152, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate while an etch process forms recesses into the silicon layer, thereby leaving an extending fin element 154. The recesses may be etched using a dry etch (e.g., chemical oxide removal), a wet etch, and/or other suitable processes. Numerous other embodiments of methods to form the fin elements 154 on the substrate 152 may also be used.

Each of the plurality of fin elements 154 also include a source region 155 and a drain region 157 where the source/drain regions 155, 157 are formed in, on, and/or surrounding the fin element 154. The source/drain regions 155, 157 may be epitaxially grown over the fin elements 154. In addition, a channel region of a transistor is disposed within the fin element 154, underlying the gate structure 158, along a plane substantially parallel to a plane defined by section AA' of FIG. 1B. In some examples, the channel region of the fin element 154 includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-K dielectric, combinations thereof, and/or other suitable material known in the art. In an embodiment, the isolation regions 156 are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-K dielectrics similar to that used for the gate dielectric 106. Similarly, in various embodiments, the metal layer 164 is substantially the same as the gate electrode 108, described above. In some cases, the gate structure 158 may also include one or more barrier layers, filler layers, and/or other appropriate layers. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

As discussed above, each of the transistor 100 and FinFET device 150 may include one or more metal gate vias, embodiments of which are described in more detail below. In some examples, the metal gate vias described herein may be part of a local interconnect structure. As used herein, the term "local interconnect" is used to describe the lowest level of metal interconnects and are differentiated from intermediate and/or global interconnects. Local interconnects span relatively short distances and are sometimes used, for example, to electrically connect a source, drain, body, and/or gate of a given device, or those of nearby devices. Additionally, local interconnects may be used to facilitate a vertical connection of one or more devices to an overlying metallization layer (e.g., to an intermediate interconnect layer), for example, through one or more vias. Interconnects (e.g., including local, intermediate, or global interconnects), in general, may be formed as part of back-end-of-line (BEOL) fabrication processes and include a multi-level network of metal wiring. Moreover, any of a plurality of IC circuits and/or devices (e.g., such as the transistor 100 or FinFET 150) may be connected by such interconnects.

With the aggressive scaling and ever-increasing complexity of advanced IC devices and circuits, contact and local interconnect design has proved to be a difficult challenge. By way of example, forming a reliable contact to a metal gate electrode (e.g., such as the gate electrode 108 or the metal layer 164, discussed above) requires a reliable and low resistance metal gate via. However, as IC device scaling continues, a bottom dimension of a metal gate via (e.g., width of the metal gate via at the bottom of the metal gate via) becomes smaller and resistance at an interface between the metal gate via and the underlying metal gate electrode becomes more dominant. As a result, device performance (e.g., device speed) is degraded. In addition, metal gate via etching and metal gap fill capabilities become much more difficult due to the highly-scaled metal gate via. In at least some cases, this could lead to premature stoppage of a metal gate via etching process (e.g., resulting in incomplete formation of the metal gate via) or cause a serious void in the metal gate via and degrade device performance. In some cases, a glue layer disposed along a sidewall of the metal gate via may also seriously degrade device performance due to the high resistance of the glue layer. This problem becomes more pronounced as device dimensions continue to shrink. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a fabrication process for contact structures including metal gate vias. In some embodiments, a cut metal method for the formation of metal gate vias, which are used to provide electrical contact to an underlying metal gate electrode, is disclosed. The disclosed metal gate vias may at times be referred to by the term “VG” (via gate). Thus, in some cases, the cut metal method disclosed herein may also be referred to as a cut VG metal method. Generally, and in various embodiments, the cut metal method disclosed herein provides a metal gate via by forming a metal layer over a gate stack, performing a cut metal photolithography process, and performing a cut metal etching process, thereby forming the metal gate via. Such a process is in contrast to at least some conventional methods of metal gate via formation, which include patterning and etching to form a metal gate via opening (which in some cases may be incompletely formed due to the highly-scaled device dimensions), followed by metal deposition (subject to metal gap fill issues) to form the metal gate via, which can result in incomplete formation of metal gate vias and/or voids formed within the metal gate via.

In accordance with some embodiments, the cut metal method disclosed provides a tapered metal gate via structure having a smaller top dimension (e.g., width of the metal gate via at the top of the metal gate via) as compared to a larger bottom dimension (e.g., width of the metal gate via at the bottom of the metal gate via). The top dimension (e.g., width) of the metal gate via, while being smaller than the bottom dimension (e.g., width), may in some embodiments be similar in size as compared to a top dimension (e.g., width) of a conventional metal gate via structure. In addition, and in accordance with some embodiments, there is no glue layer along sidewalls of the metal gate via, providing much better device performance due to elimination of parasitic glue layer resistance. In some embodiments, the larger bottom dimension (e.g., provided by the tapered metal gate via structure) provides a larger interfacial area between the metal gate via and an underlying metal gate electrode, resulting in a greatly reduced interface resistance and enhanced device performance (e.g., including enhanced device speed). In addition, and in various examples, the disclosed cut metal method does not require etching to form a metal gate via opening and metal deposition (metal gap fill), thus avoiding challenges faces by at least some existing implementations. As a result, the disclosed cut metal method enables better process feasibility, especially for highly-scaled devices. Thus, embodiments of the present disclosure provide for reduced interface resistance between a metal gate via and an underlying metal gate electrode (e.g., by providing a larger contact area). Further, aspects of the present disclosure solve the serious metal gate via etching and metal gap fill issues associated with at least some conventional ultra-small metal gate via structures. Additional details of embodiments of the present disclosure are provided below, and additional benefits and/or other advantages will become apparent to those skilled in the art having benefit of the present disclosure.

Figure 2:
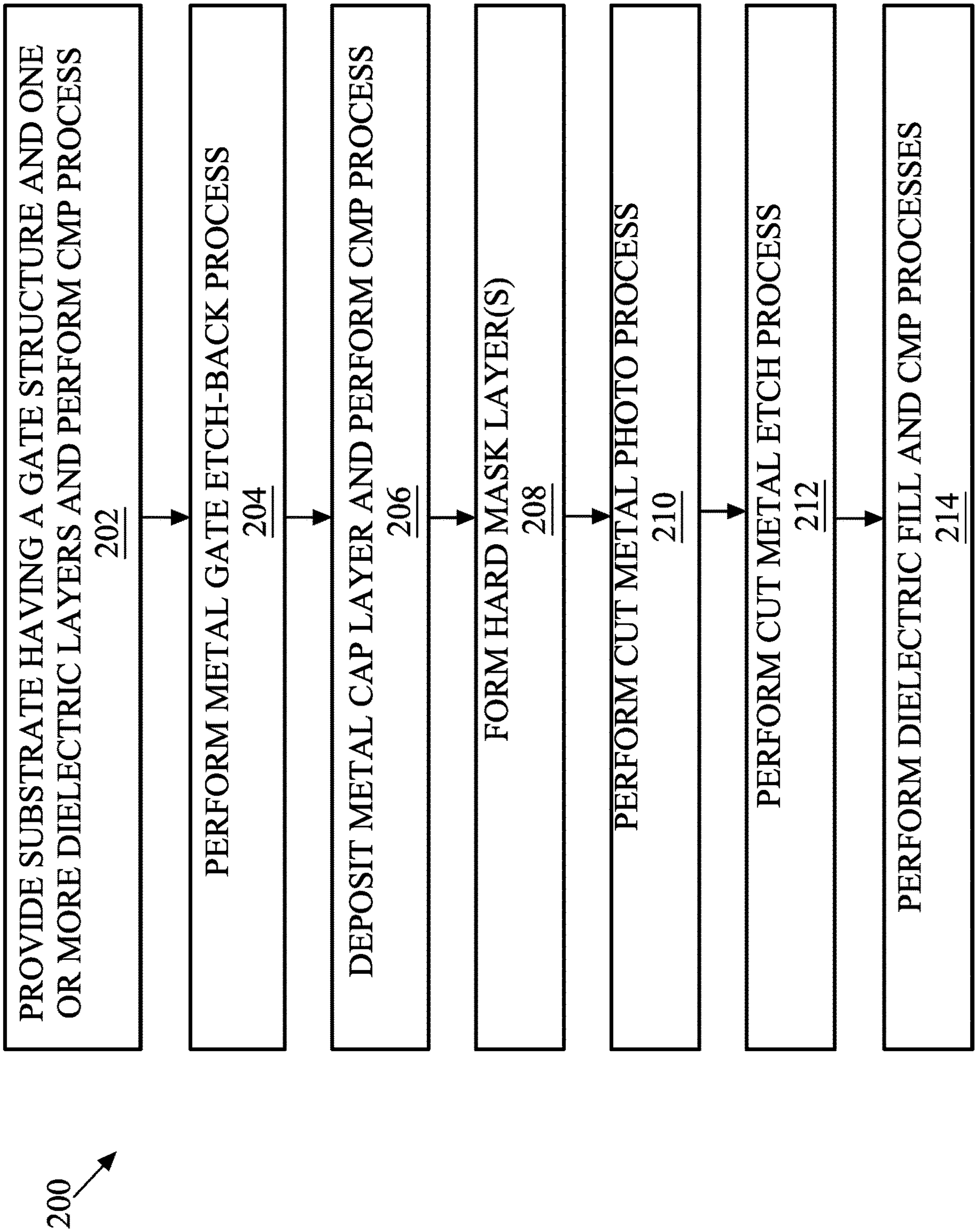
FIG. 2 is a flow chart of a method of forming contact structures including metal gate vias, according to some embodiments.

Referring now to FIG. 2, illustrated is a method 200 of forming contact structures including metal gate vias, in accordance with some embodiments. The method 200 is described below in more detail with reference to FIGS. 3A/3B-9A/9B. FIGS. 3A-9A provide cross-sectional views of a device 300 along a plane substantially parallel to a plane defined by section BB' of FIG. 1B (parallel to the direction of the gate structure 158) and FIGS. 3B-9B provide cross-sectional views of the device 300 along a plane substantially parallel to a plane defined by section AA' of FIG. 1B (perpendicular to the direction of the gate structure 158). The method 200, as well as other methods discussed herein, may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 200. To be sure, in various embodiments, the method 200, as well as other methods discussed herein, may be implemented on other devices such as GAA devices, Ω-gate devices, or Π-gate devices, as well as strained-semiconductor devices, SOI devices, PD-SOI devices, FD-SOI devices, or other devices as known in the art.

It is understood that parts of the method 200, as well as other methods discussed herein, and/or any of the exemplary transistor devices discussed with reference to the method 200, or other methods discussed herein, may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-type field-effect transistors (PFETs), N-type FETs (NFETs), MOSFETs, CMOS transistors, bipolar transistors, high voltage transistors, high frequency transistors, other memory cells, and/or combinations thereof.

Figure 3A:
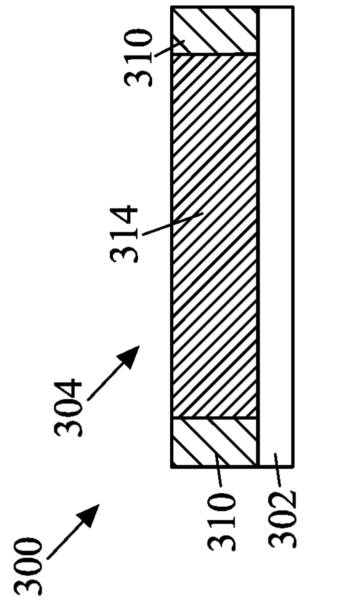
FIGS. 3A, 4A, 5A, 6A, 7A, 8A, and 9A provide cross-sectional views of a device at intermediate stages of fabrication and processed in accordance with the method of FIG. 2, along a plane substantially parallel to a plane defined by section BB' of FIG. 1B, according to some embodiments.

The method 200 begins at block 202 where a substrate having a gate structure and one or more dielectric layers is provided and a CMP process is performed. With reference to FIGS. 3A/3B, and in an embodiment of block 202, a device 300 having a substrate 302 and including a gate structure 304 is provided. In some embodiments, the substrate 302 may be substantially the same as either of the substrates 102, 152, described above. A region of the substrate 302 upon which the gate structure 304 is formed, and including regions of the substrate 302 between adjacent gate structures, may include an active region of the substrate 302. In some embodiments, regions adjacent to the gate structure 304 (parallel to a plane defined by section AA' of FIG. 1B) may include a source region, a drain region, or a body region. In various embodiments, the gate structure 304 may include an interfacial layer formed over the substrate 302, a gate dielectric layer formed over the interfacial layer, and a metal gate (MG) layer 314 formed over the gate dielectric layer. In some embodiments, each of the interfacial layer, the dielectric layer, and the metal gate layer 314 of the gate structure 304 may be substantially the same as those described above with respect to the transistor 100 and the FinFET 150. In addition, the gate structure 304 may include sidewall spacer layers 316. In various embodiments, the sidewall spacer layers 316 include $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric materials. In some embodiments, the sidewall spacer layers 316 include multiple layers, such as main spacer walls, liner layers, and the like. By way of example, the sidewall spacer layers 316 may be formed by depositing a dielectric material over the device 300 and anisotropically etching back the dielectric material. In some embodiments, the etch-back process (e.g., for spacer formation) may include a multiple-step etching process to improve etch selectivity and provide over-etch control.

In a further embodiment of block 202, and as shown in FIG. 3A, a dielectric layer 310 may be formed (e.g., parallel to a plane defined by section BB' of FIG. 1B) at opposite ends of the metal gate layer 314 of the gate structure 304. The dielectric layer 310 may, in some cases, provide isolation between metal gate layers of adjacent devices. In some embodiments, the dielectric layer 310 may be formed using a cut metal gate process, where a portion of the metal gate layer 314 is removed (e.g., etched) within a cut metal region to form a recess, and the dielectric layer 310 is deposited to fill the recess and provide isolation. In various examples, the dielectric layer 310 may include SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or a combination thereof. In some embodiments, the dielectric layer 310 may be deposited by CVD, ALD, PVD, or other suitable process.

Figure 3B:
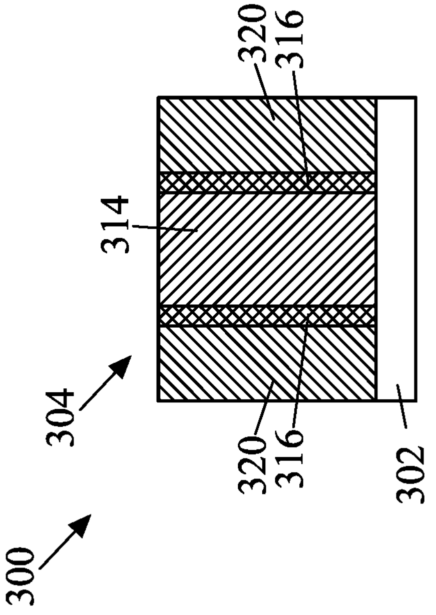
FIGS. 3B, 4B, 5B, 6B, 7B, 8B, and 9B provide cross-sectional views of a device at intermediate stages of fabrication and processed in accordance with the method of FIG. 2, along a plane substantially parallel to a plane defined by section AA' of FIG. 1B, according to some embodiments.

In addition, as shown in FIG. 3B, a dielectric layer 320 may be formed over the substrate 302 and on either side of the gate structure 304 in contact with the sidewall spacer layers 316. By way of example, the dielectric layer 320 may include an inter-layer dielectric (ILD) layer that may include materials such as tetraethylorthosilicate (TEOS) oxide, undoped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The dielectric layer 320 may be deposited by a subatmospheric CVD (SACVD) process, a flowable CVD process, or other suitable deposition technique. In some embodiments, portions of the dielectric layer 320 may be removed at a subsequent stage of processing to form a metal layer in contact with a source region, drain region, or body region that may be disposed adjacent to the gate structure 304. After formation of the gate structure 304, sidewall spacer layers 316, dielectric layer 310, and dielectric layer 320, a CMP process may be performed to remove excess material and planarize the top surface of the device 300. In some embodiments, the CMP process may include a metal gate CMP process.

Figure 4A:
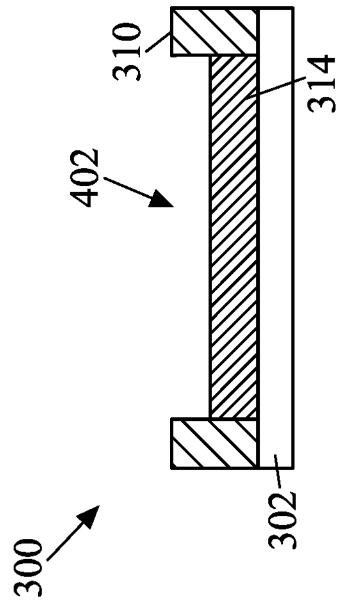
Figure 4B:
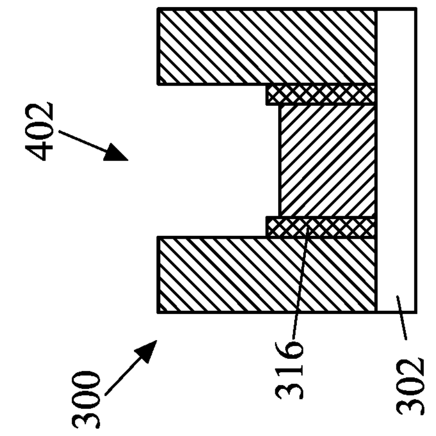

The method 200 proceeds to block 204 where a metal gate etch-back process is performed. With reference to FIGS. 3A/3B and 4A/4B, and in an embodiment of block 204, a metal gate etch-back process is performed to etch the metal gate layer 314 of the gate structure 304 and form a recess 402. In some embodiments, the etch-back process of block 204 may include a wet etching process, a dry etching process, or a combination thereof. In some examples, the etch-back process of block 204 may also etch the sidewall spacer layers 316, as shown in FIG. 4B. After the etch-back process, and in at least some embodiments, a top surface of the metal gate layer 314 is recessed with respect to a top surface of the sidewall spacer layers 316. Stated another way, a plane defined by a top surface of the metal gate layer 314 may be disposed beneath a plane defined by a top surface of the sidewall spacer layers 316, after the etch-back process. By way of example, the recess 402, as collectively defined by the etched-back metal gate layer 314 and the etched-back sidewall spacer layers 316, may generally provide a T-shaped recess, as shown in FIG. 4B.

Figure 5A:
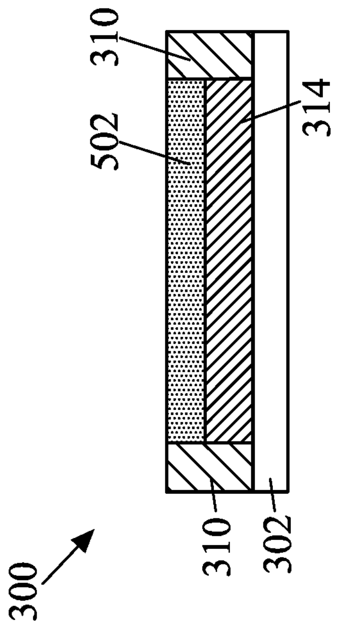
Figure 5B:
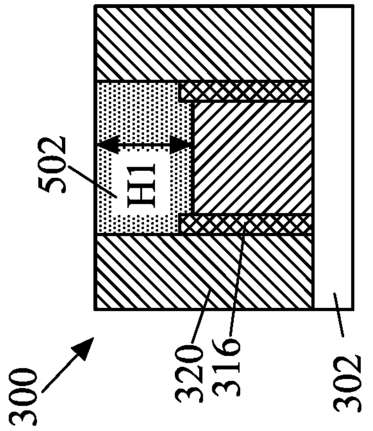

The method 200 proceeds to block 206 where a metal cap layer is deposited, and a CMP process is performed. With reference to FIGS. 4A/4B and 5A/5B, and in an embodiment of block 206, a metal cap layer 502 is deposited over the device 300 including within the recess 402 and over the etched-back metal gate layer 314 and the etched-back sidewall spacer layers 316. After deposition of the metal cap layer 502, and in some embodiments, a CMP process is performed to remove excess material and planarize the top surface of the device 300. In some embodiments, the metal cap layer 502 may include Co, W, Ru, Al, Mo, Ti, TiN, TiSi, CoSi, NiSi, Cu, TaN, or a combination thereof. In various examples, the metal cap layer 502 may be deposited by PVD, CVD, ALD, e-beam evaporation, or other suitable process. In some cases, the metal cap layer 502 has a height 'H1' in a range of about 0.5 nm-30 nm. In some embodiments, a glue layer may be optionally formed beneath the metal cap layer 502, interposing the metal cap layer 502 and the underlying metal gate layer 314. If present, the glue layer may include Co, W, Ru, Al, Mo, Ti, TiN, TiSi, CoSi, NiSi, Cu, TaN, or a combination thereof. However, even if a glue layer is present between the metal gate layer 314 and the metal cap layer 502, there will be no glue layer along sidewalls of the patterned metal cap layer 502 (which defines a metal gate via for the device 300) formed during a subsequent stage of processing, as described below. In addition, and because the recess 402 generally defines a T-shaped recess, the metal cap layer 502 formed within the recess 402 may generally define a T-shaped metal cap layer, as shown in FIG. 5B.

The method 200 proceeds to block 208 where one or more hard mask layers are formed. Referring to FIGS. 5A/5B and 6A/6B, and in an embodiment of block 208, a first hard mask layer 602 is formed over the device 300, and a second hard mask layer 604 is formed over the first hard mask layer 602. In some embodiments, the first hard mask layer 602 and the second hard mask layer 604 may include etch stop layers. In some cases, the hard mask layers 602, 604 provide a metal gate via hard mask used for patterning of a metal gate via, as described in more detail below. By way of example, the hard mask layers 602, 604 may include Ti, TiN, TiC, TiCN, Ta, TaN, TaC, TaCN, W, WN, WC, WCN, TiAl, TiAlN, TiAlC, TiAlCN, or combinations thereof. In various embodiments, the hard mask layers 602, 604 may be deposited by a SACVD process, a flowable CVD process, an ALD process, a PVD process, or other suitable deposition technique.

Figure 6A:
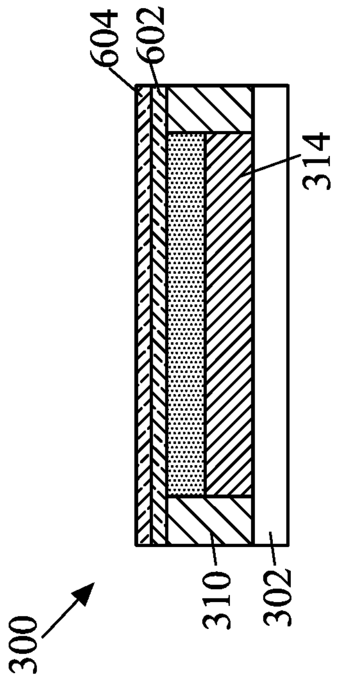
Figure 6B:
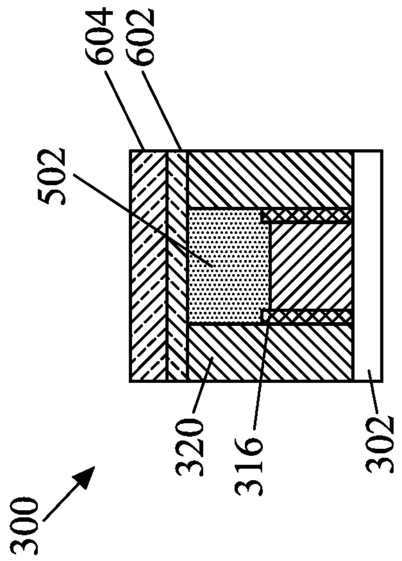
Figure 7A:
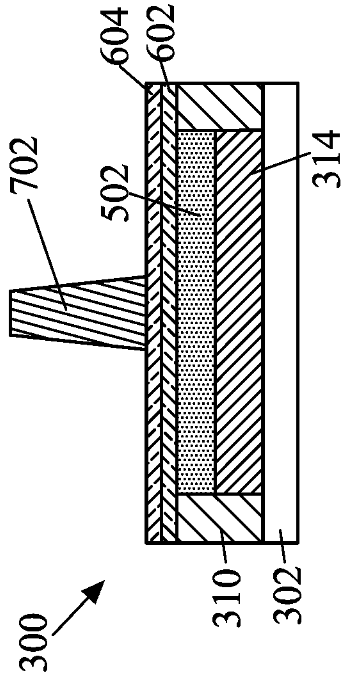
Figure 7B:
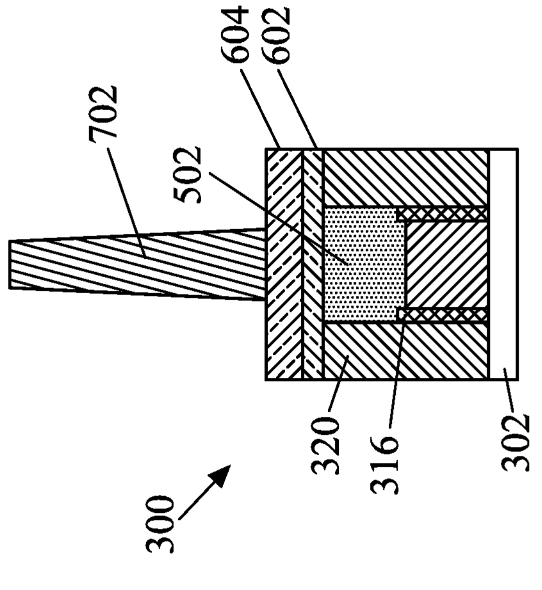

The method 200 proceeds to block 210 where a cut metal photolithography process is performed. Referring to FIGS. 6A/6B and 7A/7B, and in an embodiment of block 210, a cut metal photolithography process includes depositing a resist layer (e.g., by spin-coating), exposing the resist layer, and developing the exposed resist layer to form a patterned resist layer 702. In some embodiments, the patterned resist layer 702 may be used as a masking layer to define a subsequently formed metal gate via, as described below. The patterned resist layer 702, in some embodiments and as shown in FIGS. 7A/7B, may include a tapered profile having a smaller top dimension (e.g., width of the patterned resist layer 702 at the top of the patterned resist layer 702) as compared to a larger bottom dimension (e.g., width of the patterned resist layer 702 at the bottom of the patterned resist layer 702). In some embodiments, the tapered patterned resist layer 702 may provide at least partly for the tapered profile of the subsequently formed metal gate via structure, described below.

The method 200 proceeds to block 212 where a cut metal etching process is performed. Referring to FIGS. 7A/7B and 8A/8B, and in an embodiment of block 212, a cut metal etching process is performed to remove portions of the hard mask layers 602, 604, portions of the metal cap layer 502, and portions of the glue layer (if present) disposed outside of a region protected by the patterned resist layer 702 to form recesses 802 that expose portions of the etched-back metal gate layer 314 as well as the etched-back sidewall spacer layers 316. The cut metal etching process of block 212 may include a wet etching process, a dry etching process, or a combination thereof. In some embodiments, the cut metal etching process may be selective to the hard mask layers 602, 604 and the metal cap layer 502 such that the cut metal etching process etches the portions of the hard mask layers 602, 604 and portions of the metal cap layer 502 (disposed outside of a region protected by the patterned resist layer 702) without substantially etching other nearby layers (e.g., such as the dielectric layers 310, 320, sidewall spacer layers 316, or the metal gate layer 314). The cut metal etching process may thus expose portions of the etched-back metal gate layer 314 and the etched-back sidewall spacer layers 316. In various embodiments, and after the cut metal etching process, the patterned resist layer 702 and remaining portions of the hard mask layers 602, 604 may be removed. For example, the patterned resist layer 702 may be removed using an ashing process, a solvent, or other suitable photoresist stripping technique, and the remaining portions of the hard mask layers 602, 604 may be removed using a wet etching process, a dry etching process, or a combination thereof.

Figure 8A:
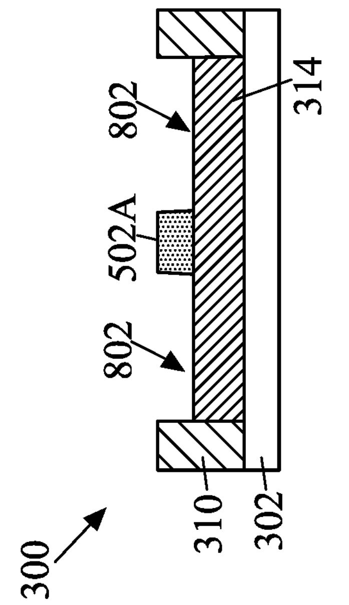
Figure 8B:
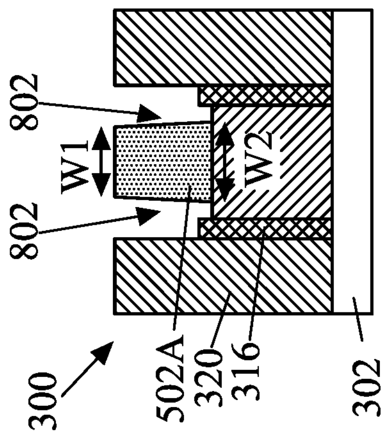
Figure 9A:
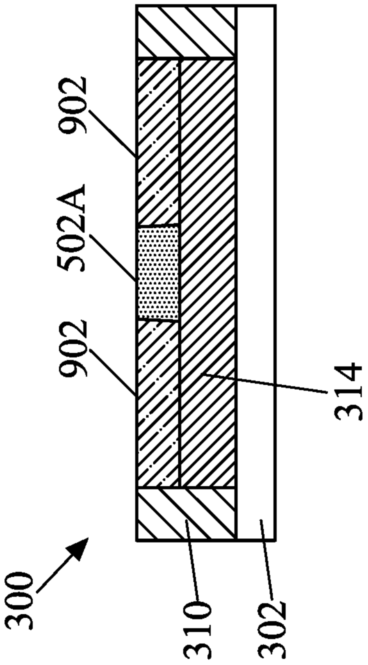
Figure 9B:
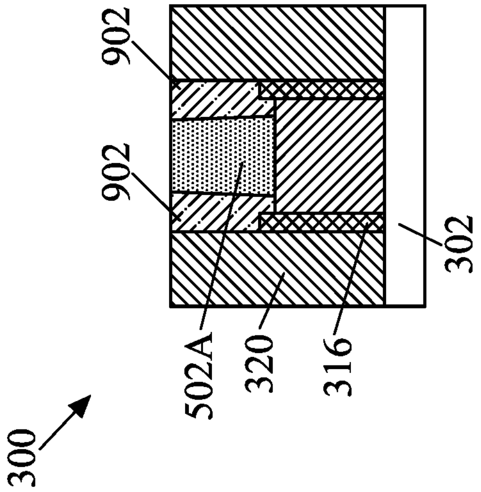

In various embodiments, a portion of the metal cap layer 502A that remains after the cut metal etching process (e.g., disposed between the recesses 802) may define a metal gate via for the device 300 that provides electrical connectivity to the underlying metal gate layer 314 of the gate structure 304. Thus, portion of the metal cap layer 502A may be equivalently referred to as a via feature. In addition, and in some embodiments, the portion of the metal cap layer 502A may be substantially aligned (e.g., centered) with the metal gate layer 314. It is also noted that while there may be a glue layer present between the metal gate layer 314 and the portion of the metal cap layer 502A, as discussed above, there is no glue layer present along sidewalls of the portion of the metal cap layer 502A. Also, as shown in FIGS. 8A/8B, the metal cap layer portion 502A has a tapered profile having a smaller top dimension ‘W1’ (e.g., width of the metal cap layer portion 502A at the top of the metal cap layer portion 502A) as compared to a larger bottom dimension ‘W2’ (e.g., width of the metal cap layer portion 502A at the bottom of the metal cap layer portion 502A). In some embodiments, the top dimension ‘W1’ of the metal cap layer portion 502A is in a range of about 0.5 nm-30 nm, and the bottom dimension ‘W2’ of the metal cap layer portion 502A is in a range of about 0.5 nm-40 nm. Additional details regarding the structure and dimensions of various features of the metal cap layer portion 502A (metal gate via), and of the device 300 including the metal gate via in general, are described below with reference to FIGS. 10A/10B.

The method 200 proceeds to block 214 where dielectric fill and CMP processes are performed. With reference to FIGS. 8A/8B and 9A/9B, and in an embodiment of block 214, a dielectric layer 902 is deposited over the device 300 including within the recesses 802 and over the exposed portions of the etched-back metal gate layer 314 and over the etched-back sidewall spacer layers 316. After deposition of the dielectric layer 902, and in some embodiments, a CMP process is performed to remove excess material and planarize the top surface of the device 300. Thus, the dielectric layer 902 may provide isolation features on either side of the metal cap layer portion 502A (e.g., the metal gate via of the device 300). In some embodiments, the dielectric layer 902 may include SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or a combination thereof. In various examples, the dielectric layer 902 may be deposited by CVD, ALD, PVD, or other suitable process. In some embodiments, and after the dielectric fill and CMP processes of block 214, top surfaces of the metal cap layer portion 502A, the dielectric layer 902, the dielectric layer 310, and the dielectric layer 320 may be substantially level (coplanar) with each other.

The device 300 may undergo further processing to form various features and regions known in the art. For example, subsequent processing may form various contacts/vias/lines and multilayer interconnect features (e.g., metal layers and interlayer dielectrics) on the substrate 302, configured to connect the various features (e.g., including the metal gate via) to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figure 10A:
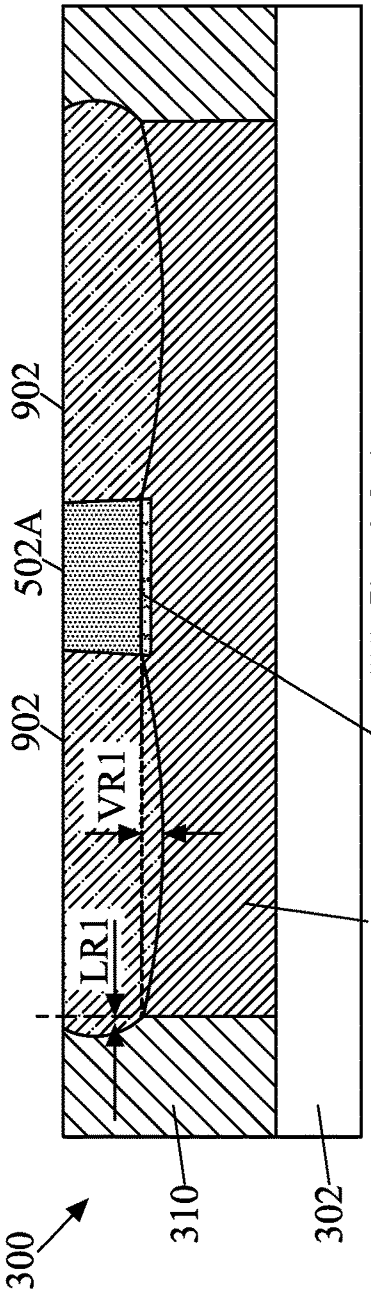
FIG. 10A provides an enlarged view of the device as shown in FIG. 9A, and FIG. 10B provides an enlarged view of the device as shown in FIG. 9B, in accordance with some embodiments.
Figure 10B:
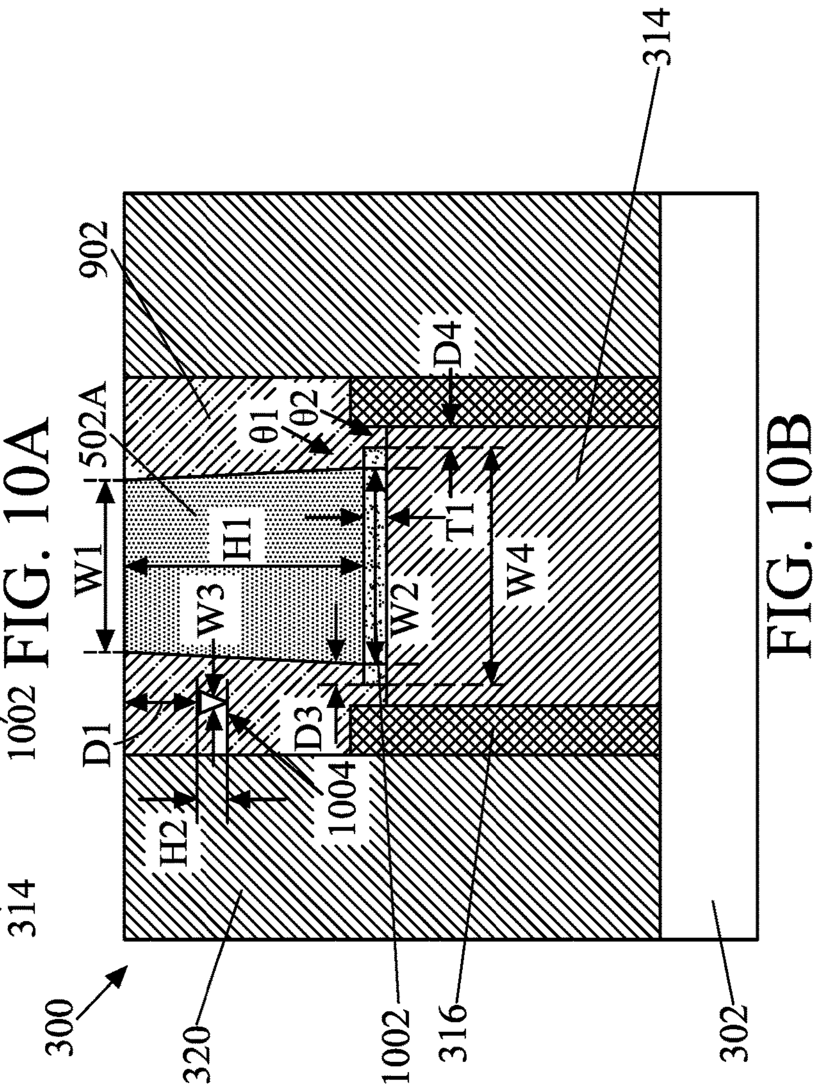

Referring now to FIGS. 10A/10B, further details regarding the structure and dimensions of various features of the metal cap layer portion 502A (metal gate via), and of the device 300 including the metal gate via in general, are provided. In various embodiments, the device 300 shown in FIG. 10A provides an enlarged view of the device 300 shown in FIG. 9A, and the device 300 shown in FIG. 10B provides an enlarged view of the device 300 shown in FIG. 9B. However, FIGS. 10A/10B also illustrate an optional glue layer 1002 which may be disposed between the metal gate layer 314 and the portion of the metal cap layer 502A (metal gate via), as discussed above. FIG. 10A further illustrates a lateral recess 'LR1' of the dielectric layer 310 and a vertical recess 'VR1' of the metal gate layer 314 that may be formed, for example, during the cut metal etching process of block 212. In some embodiments, the lateral recess 'LR1' may be in a range of about 0.5 nm-30 nm, and the vertical recess 'VR1' may be in a range of about 0.5 nm-30 nm. However, in some cases, there may be no lateral recess 'LR1' or vertical recess 'VR1'.

Figure 23:
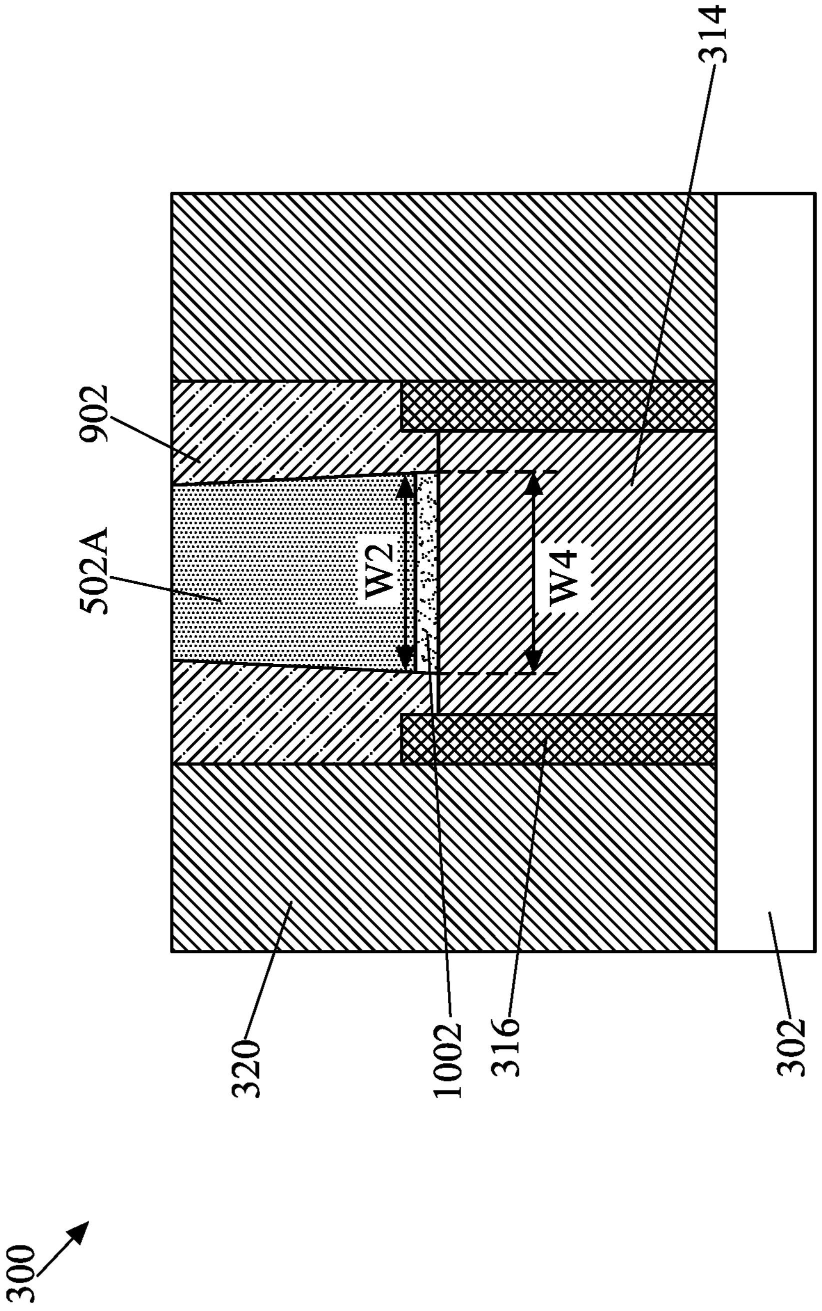
FIGS. 23, 24, and 25 provide further embodiments of devices processed in accordance with the method of FIG. 2.

With reference to FIG. 10B, and in some embodiments, a void 1004 may be formed in the dielectric layer 902. If the void 1004 is present, which is not always the case, a distance 'D1' between the void 1004 and the top surface of the dielectric layer 902 may be in a range of about 1 nm-30 nm. The void 1004, if present, may have a width dimension 'W3' in a range of about 0.5 nm-30 nm, and a height dimension 'H2' in a range of about 0.5 nm-30 nm. The void 1004 can, in some cases, be formed during deposition of the dielectric layer 902, especially for highly-scaled devices where the gap fill dimension is small. However, regardless of whether voids (e.g., such as the void 1004) are present within the dielectric layer 902, embodiments of the present disclosure may effectively prevent the formation of voids within the metal gate via (e.g., the metal cap layer portion 502A). In some examples, the metal cap layer 502 may have a height in a range of about 0.5 nm-30 nm, as previously noted. In some embodiments, the top dimension 'W1' of the metal cap layer portion 502A is in a range of about 0.5 nm-30 nm, and the bottom dimension 'W2' of the metal cap layer portion 502A is in a range of about 0.5 nm-40 nm, as also previously noted. In some cases, an angle '⊖1' is defined at a bottom of the metal cap layer portion 502A, where the angle '⊖1' may be in a range of about 90 degrees-150 degrees. The glue layer 1002, if present, may have a thickness 'Ti' in a range of about 0.5 nm-30 nm. In addition, if present, the glue layer 1002 may extend beyond metal cap layer portion 502A by a distance 'D3' of about 10 nm. In addition, and in some embodiments, a dimension 'W4' of the glue layer 1002, if present, is in a range of about 0.5 nm-50 nm. In some cases, the dimension 'W4' may be substantially the same as the bottom dimension 'W2' of the metal cap layer portion 502A (e.g., as shown in FIG. 23). In embodiments including the glue layer 1002, a distance 'D4' may be defined between an end of the glue layer 1002 and an adjacent sidewall spacer layer 316, where the distance 'D4' is about 10 nm. In some embodiments, an angle '⊖2' may also be defined at a bottom of the glue layer 1002, if present, where the angle '⊖2' may be in a range of about 90 degrees-150 degrees.

Figure 11:
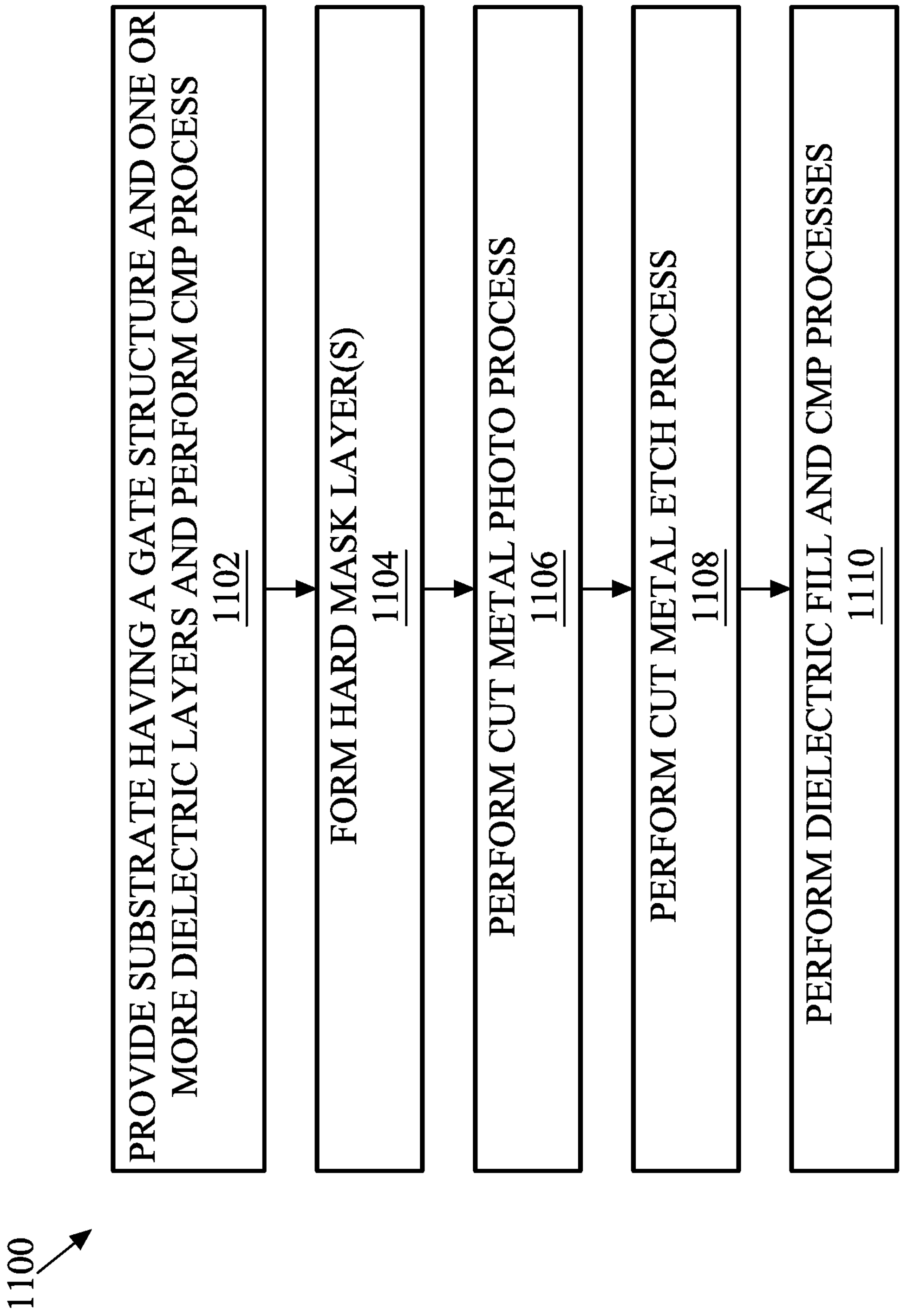
FIG. 11 is a flow chart of another method of forming contact structures including metal gate vias, according to some embodiments.

Referring now to FIG. 11, illustrated is a method 1100 of forming contact structures including metal gate vias, in accordance with some embodiments. The method 1100 is described below in more detail with reference to FIGS. 12A/12B-16A/16B. FIGS. 12A-16A provide cross-sectional views of a device 1200 along a plane substantially parallel to a plane defined by section BB' of FIG. 1B (parallel to the direction of the gate structure 158) and FIGS. 12B-16B provide cross-sectional views of the device 1200 along a plane substantially parallel to a plane defined by section AA' of FIG. 1B (perpendicular to the direction of the gate structure 158). In various examples, the method 1100 may be similar to the method 200, discussed above. Thus, one or more aspects discussed above with reference to the method 200 (and associated device 300) may also apply to the method 1100 (and associated device 1200). In addition, for clarity of discussion, aspects of the method 1100 overlapping with the method 200 may be only briefly discussed, while focusing the discussion on the distinct aspects of the method 1100.

Figure 12A:
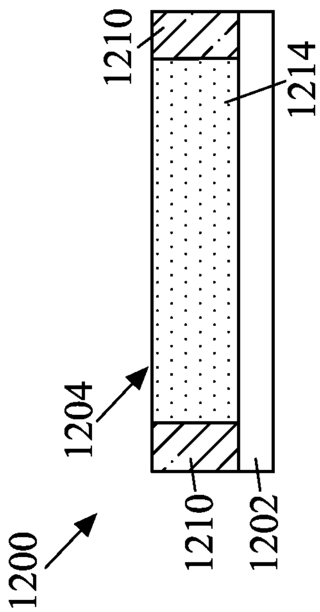
FIGS. 12A, 13A, 14A, 15A, and 16A provide cross-sectional views of a device at intermediate stages of fabrication and processed in accordance with the method of FIG. 11, along a plane substantially parallel to a plane defined by section BB' of FIG. 1B, according to some embodiments.

The method 1100 begins at block 1102 where a substrate having a gate structure and one or more dielectric layers is provided and a CMP process is performed. With reference to FIGS. 12A/12B, and in an embodiment of block 1102, a device 1200 having a substrate 1202 and including a gate structure 1204 is provided. In some embodiments, the substrate 1202 may be substantially the same as the substrates 102, 152, 302, described above. In various embodiments, the gate structure 1204 may include an interfacial layer formed over the substrate 1202, a gate dielectric layer formed over the interfacial layer, and a metal gate (MG) layer 1214 formed over the gate dielectric layer. In some embodiments, each of the interfacial layer, the dielectric layer, and the metal gate layer 1214 of the gate structure 1204 may be substantially the same as those described above with respect to the transistor 100, the FinFET 150, and the device 300. In at least some embodiments, the metal gate layer 1214 includes Co, W, Ru, Al, Mo, Ti, TiN, TiSi, CoSi, NiSi, Cu, TaN, or a combination thereof. In addition, the gate structure 1204 may include sidewall spacer layers 1216, which may be substantially the same as the sidewall spacer layers 316, discussed above.

Figure 12B:
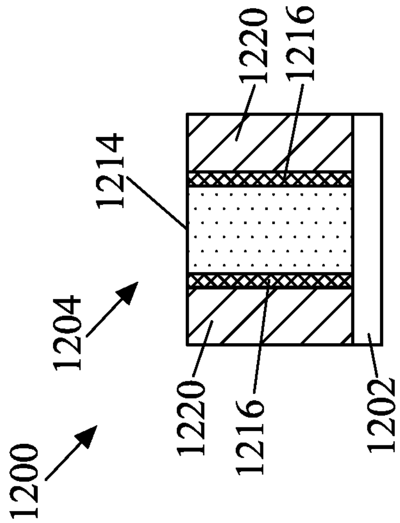
FIGS. 12B, 13B, 14B, 15B, and 16B provide cross-sectional views of a device at intermediate stages of fabrication and processed in accordance with the method of FIG. 11, along a plane substantially parallel to a plane defined by section AA' of FIG. 1B, according to some embodiments.

In a further embodiment of block 1102, and as shown in FIG. 12A, a dielectric layer 1210 may be formed (e.g., parallel to a plane defined by section BB' of FIG. 1B) at opposite ends of the metal gate layer 1214 of the gate structure 1204. The dielectric layer 1210 may, in some cases, provide isolation between metal gate layers of adjacent devices and may be substantially the same as the dielectric layer 310, described above. In addition, as shown in FIG. 12B, a dielectric layer 1220 may be formed over the substrate 1202 and on either side of the gate structure 1204 in contact with the sidewall spacer layers 1216. By way of example, the dielectric layer 1220 may be substantially the same as the dielectric layer 320, discussed above. After formation of the gate structure 1204, sidewall spacer layers 1216, dielectric layer 1210, and dielectric layer 1220, a CMP process may be performed to remove excess material and planarize the top surface of the device 1200.

The method 1100 proceeds to block 1104 where one or more hard mask layers are formed. Referring to FIGS. 12A/12B and 13A/13B, and in an embodiment of block 1104, a first hard mask layer 1302 is formed over the device 1200, and a second hard mask layer 1304 is formed over the first hard mask layer 1302. In some embodiments, the first hard mask layer 1302 and the second hard mask layer 1304 may include etch stop layers. In some cases, the hard mask layers 1302, 1304 provide a metal gate via hard mask used for patterning of a metal gate via, as described herein. In some embodiments, the hard mask layers 1302, 1304 may be substantially the same as the hard mask layers 602, 604, discussed above. Thus, rather than performing a metal gate etch-back process and depositing a metal cap layer prior to deposition of the hard mask layers, as discussed with reference to the method 200, the method 1100 directly forms the hard mask layers 1302, 1304 over the metal gate layer 1214 of the gate structure 1204. As a result, and instead of using a metal cap layer to define the metal gate via (as performed in the method 200), a top portion of the metal gate layer 1214 may be patterned during a subsequent stage of processing to define a metal gate via for the device 1200, as described below. Also, by skipping the metal gate etch-back process and the metal cap layer deposition process, the sidewall spacer layers 1216 may remain unetched.

Figure 13A:
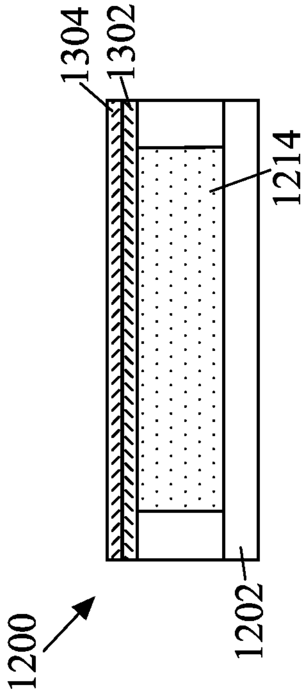
Figure 13B:
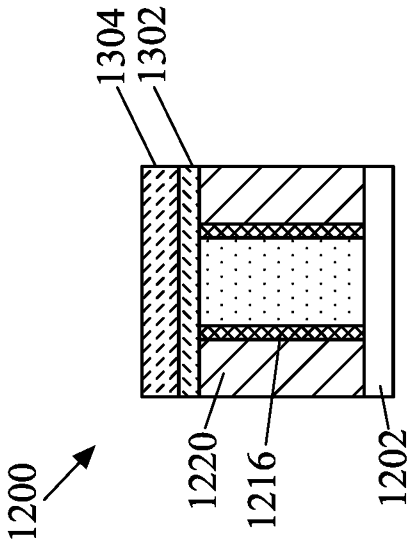
Figure 14A:
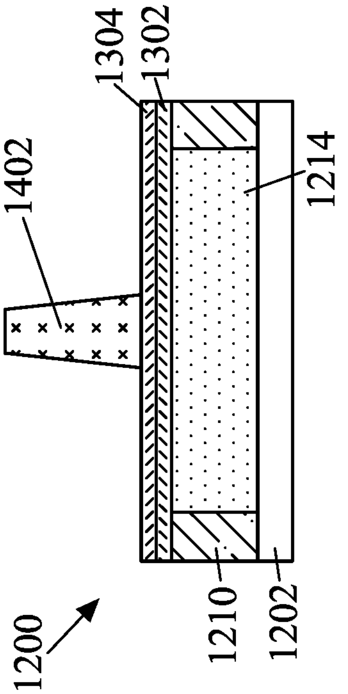
Figure 14B:
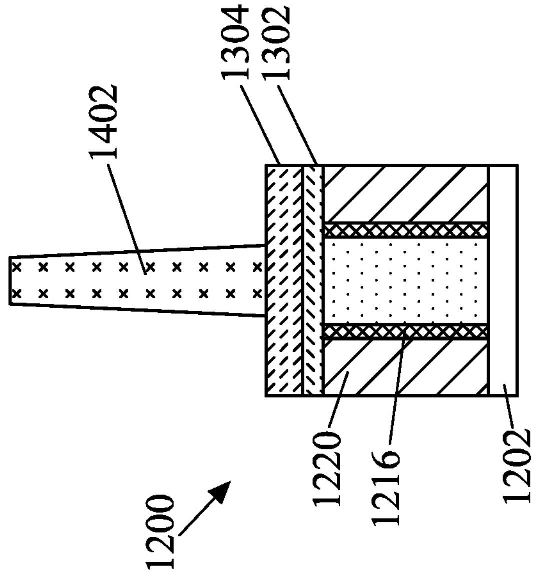

The method 1100 proceeds to block 1106 where a cut metal photolithography process is performed. Referring to FIGS. 13A/13B and 14A/14B, and in an embodiment of block 1106, a cut metal photolithography process includes depositing a resist layer (e.g., by spin-coating), exposing the resist layer, and developing the exposed resist layer to form a patterned resist layer 1402. In some embodiments, the patterned resist layer 1402 may be used as a masking layer to define a subsequently formed metal gate via, as described herein. The patterned resist layer 1402, in some embodiments and as shown in FIGS. 14A/14B, may include a tapered profile having a smaller top dimension (e.g., width of the patterned resist layer 1402 at the top of the patterned resist layer 1402) as compared to a larger bottom dimension (e.g., width of the patterned resist layer 1402 at the bottom of the patterned resist layer 1402). In some embodiments, the tapered patterned resist layer 1402 may provide at least partly for the tapered profile of the subsequently formed metal gate via structure, described herein.

The method 1100 proceeds to block 1108 where a cut metal etching process is performed. Referring to FIGS. 14A/14B and 15A/15B, and in an embodiment of block 1108, a cut metal etching process is performed to remove portions of the hard mask layers 1302, 1304 and part of a top portion of the metal gate layer 1214 disposed outside of a region protected by the patterned resist layer 1402 to form recesses 1502 that expose a bottom portion of the metal gate layer 1214. The cut metal etching process of block 1108 may include a wet etching process, a dry etching process, or a combination thereof. In some embodiments, the cut metal etching process may be selective to the hard mask layers 1302, 1304 and the metal gate layer 1214 such that the cut metal etching process etches the portions of the hard mask layers 1302, 1304 and top portions of the metal gate layer 1214 (disposed outside of a region protected by the patterned resist layer 1402) without substantially etching other nearby layers (e.g., such as the dielectric layers 1210, 1220, or the sidewall spacer layers 1216). In various embodiments, and after the cut metal etching process, the patterned resist layer 1402 and remaining portions of the hard mask layers 1302, 1304 may be removed, for example, as described above.

In various embodiments, a top portion of the metal gate layer 1214A that remains after the cut metal etching process (e.g., disposed between the recesses 1502) may define a metal gate via for the device 1200 that provides electrical connectivity to the underlying bottom portion of the metal gate layer 1214 of the gate structure 1204. Thus, the top portion of the metal gate layer 1214A may be equivalently referred to as a via feature. In some embodiments, and similar to the bottom portion of the metal gate layer 1214, the via feature (e.g., the top portion of the metal gate layer 1214A) may include more than one material layer such as one or more barrier layers, filler layers, and/or other appropriate layers (e.g., such as layers discussed above with reference to the gate stack 104 or the gate structure 158). In some examples, and in order to avoid etching all of the metal gate layer 1214 and to provide desired dimensions of the top portion of the metal gate layer 1214, parameters of the cut metal etching process may be carefully controlled (e.g., parameters such as etch time, etch temperature, etch pressure, etch chemistry, etc.) Further, the metal gate via of the device 1200 (the top portion of the metal gate layer 1214A) and the underlying metal gate layer 1214 are formed of a single, continuous metal layer. As a result, an interface between the top portion of the metal gate layer 1214A and the underlying metal gate layer 1214 is continuous. As such, there is no glue layer at the interface between the top portion of the metal gate layer 1214A and the underlying metal gate layer 1214. In addition, and like the device 300 discussed above, there is also no glue layer present along sidewalls of the metal gate via (the top portion of the metal gate layer 1214A). In some embodiments, the top portion of the metal gate layer 1214A may also be substantially aligned (e.g., centered) with the underlying bottom portion of the metal gate layer 1214.

Figure 15A:
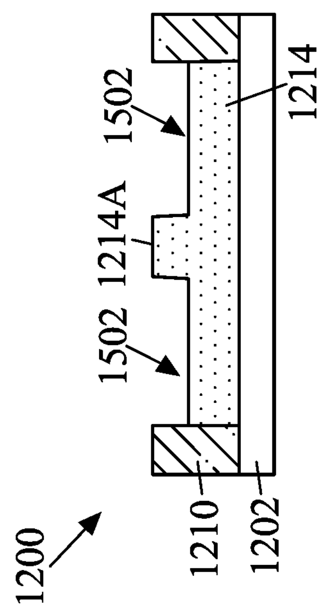
Figure 15B:
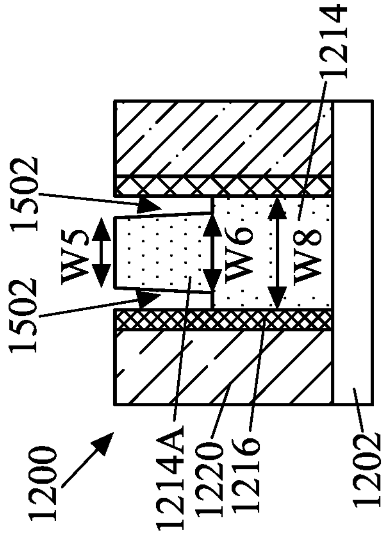
Figure 16A:
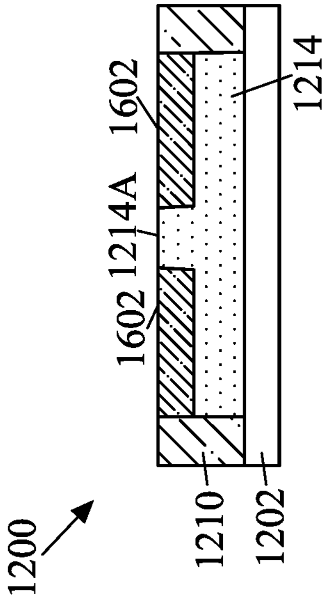
Figure 16B:
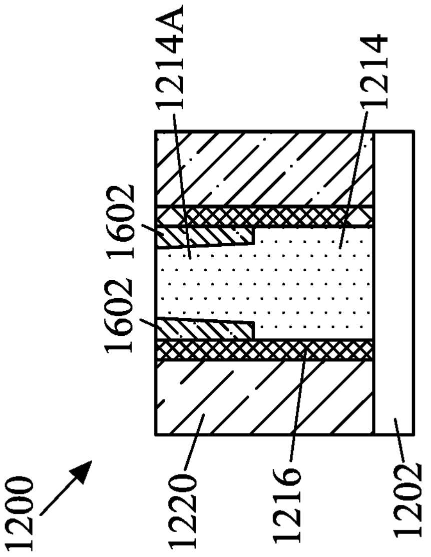

Also, as shown in FIGS. 15A/15B, the top portion of the metal gate layer 1214A has a tapered profile having a smaller top dimension 'W5' (e.g., width of the top portion of the metal gate layer 1214A at the top of the top portion of the metal gate layer 1214A) as compared to a larger bottom dimension 'W6' (e.g., width of the top portion of the metal gate layer 1214A at the bottom of the top portion of the metal gate layer 1214A). In some embodiments, the top dimension 'W5' of the top portion of the metal gate layer 1214A is in a range of about 0.5 nm-30 nm, and the bottom dimension 'W6' of the top portion of the metal gate layer 1214A is in a range of about 0.5 nm-40 nm. It is also noted that the bottom dimension 'W6' (of the top portion of the metal gate layer 1214A) is lesser than a width 'W8' (of the bottom portion of the metal gate layer 1214). Additional details regarding the structure and dimensions of various features of the top portion of the metal gate layer 1214A (metal gate via), and of the device 1200 including the metal gate via in general, are described below with reference to FIGS. 17A/17B.

The method 1100 proceeds to block 1110 where dielectric fill and CMP processes are performed. With reference to FIGS. 15A/15B and 16A/16B, and in an embodiment of block 1110, a dielectric layer 1602 is deposited over the device 1200 including within the recesses 1502 and over the exposed bottom portion of the metal gate layer 1214. After deposition of the dielectric layer 1602, and in some embodiments, a CMP process is performed to remove excess material and planarize the top surface of the device 1200. Thus, the dielectric layer 1602 may provide isolation features on either side of the top portion of the metal gate layer 1214A (e.g., the metal gate via of the device 1200). In some embodiments, the dielectric layer 1602 may be substantially the same as the dielectric layer 902, discussed above. In some embodiments, and after the dielectric fill and CMP processes of block 1110, top surfaces of the top portion of the metal gate layer 1214A, the dielectric layer 1602, the sidewall spacer layers 1216, the dielectric layer 1210, and the dielectric layer 1220 may be substantially level (co-planar) with each other.

The device 1200 may undergo further processing to form various features and regions known in the art. For example, subsequent processing may form various contacts/vias/lines and multilayer interconnect features (e.g., metal layers and interlayer dielectrics) on the substrate 1202, configured to connect the various features (e.g., including the metal gate via) to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 1100, and some process steps described above may be replaced or eliminated in accordance with various embodiments of the method 1100.

Figure 17A:
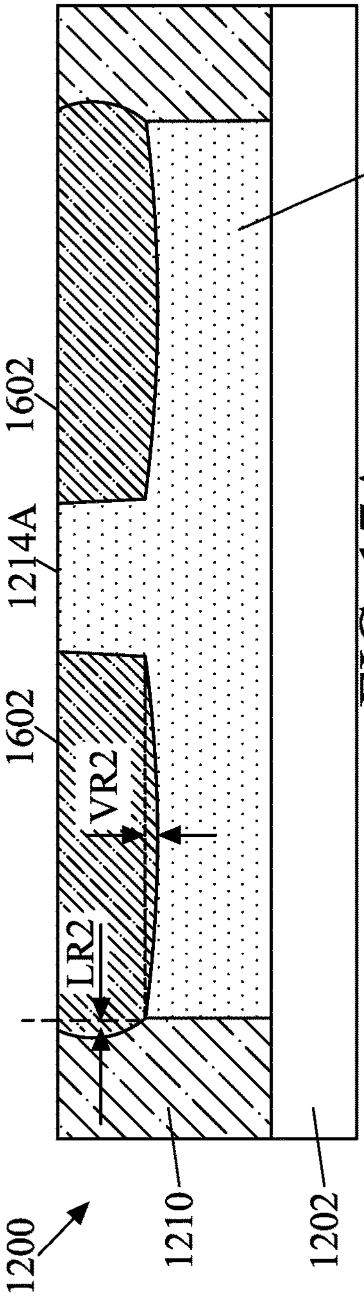
FIG. 17A provides an enlarged view of the device as shown in FIG. 16A, and FIG. 17B provides an enlarged view of the device as shown in FIG. 16B, in accordance with some embodiments.
Figure 17B:
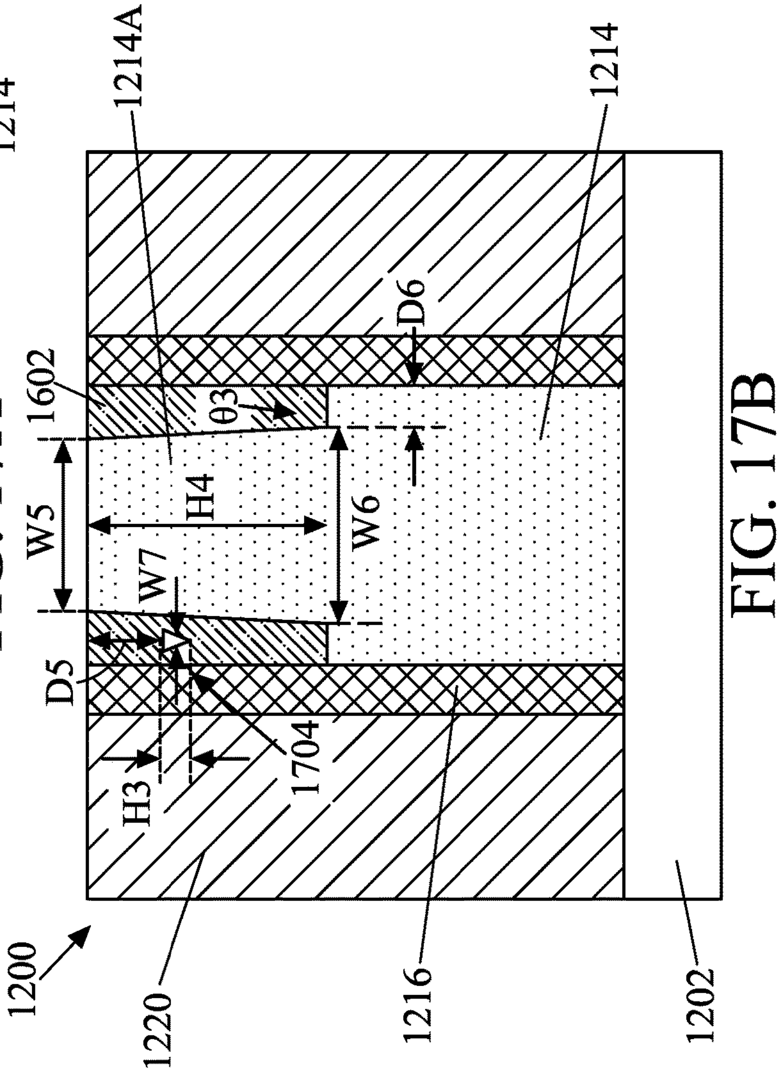

Referring to FIGS. 17A/17B, further details regarding the structure and dimensions of various features of the top portion of the metal gate layer 1214A (metal gate via), and of the device 1200 including the metal gate via in general, are provided. In various embodiments, the device 1200 shown in FIG. 17A provides an enlarged view of the device 1200 shown in FIG. 16A, and the device 1200 shown in FIG. 17B provides an enlarged view of the device 1200 shown in FIG. 16B. FIG. 17A also illustrates a lateral recess 'LR2' of the dielectric layer 1210 and a vertical recess 'VR2' of the metal gate layer 1214 that may be formed, for example, during the cut metal etching process of block 1108. In some embodiments, the lateral recess 'LR2' may be in a range of about 0.5 nm-30 nm, and the vertical recess 'VR2' may be in a range of about 0.5 nm-30 nm. However, in some cases, there may be no lateral recess 'LR2' or vertical recess 'VR2'.

With reference to FIG. 17B, and in some embodiments, a void 1704 may be formed in the dielectric layer 1602. If the void 1704 is present, which is not always the case, a distance 'D5' between the void 1704 and the top surface of the dielectric layer 1602 may be in a range of about 1 nm-30 nm. The void 1704, if present, may have a width dimension 'W7' in a range of about 0.5 nm-30 nm, and a height dimension 'H3' in a range of about 0.5 nm-30 nm. The void 1704 can, in some cases, be formed during deposition of the dielectric layer 1602, especially for highly-scaled devices where the gap fill dimension is small. However, regardless of whether voids (e.g., such as the void 1704) are present within the dielectric layer 1602, embodiments of the present disclosure may effectively prevent the formation of voids within the metal gate via (e.g., the top portion of the metal gate layer 1214A). In some examples, the top portion of the metal gate layer 1214A may have a height 'H4' in a range of about 0.5 nm-30 nm. In some embodiments, the top dimension 'W5' of the top portion of the metal gate layer 1214A is in a range of about 0.5 nm-30 nm, and the bottom dimension 'W6' of the top portion of the metal gate layer 1214A is in a range of about 0.5 nm-40 nm, as previously noted. In some cases, an angle '03' is defined at a bottom of the top portion of the metal gate layer 1214A, where the angle '03' may be in a range of about 90 degrees-150 degrees. In some embodiments, a distance 'D6' may be defined between a bottom edge of the top portion of the metal gate layer 1214A and an adjacent sidewall spacer layer 1216, where the distance 'D6' is about 10 nm.

Figure 18:
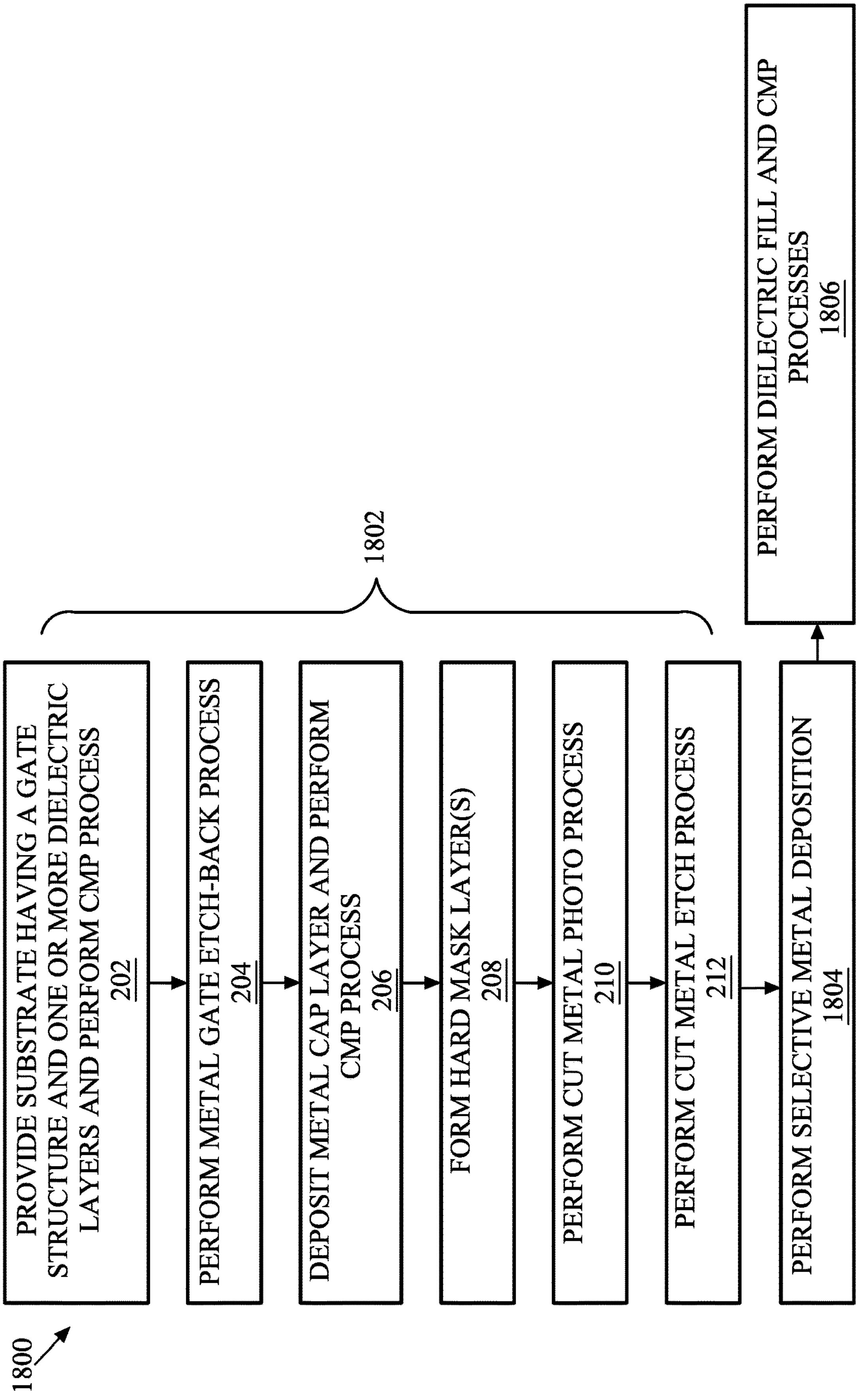
FIG. 18 is a flow chart of still another method of forming contact structures including metal gate vias, according to some embodiments.

With reference now to FIG. 18, illustrated is a method 1800 of forming contact structures including metal gate vias, in accordance with some embodiments. The method 1800 is described below in more detail with reference to FIGS. 19A/19B-21A/21B. FIGS. 19A-21A provide cross-sectional views of a device 1900 along a plane substantially parallel to a plane defined by section BB' of FIG. 1B (parallel to the direction of the gate structure 158) and FIGS. 19B-21B provide cross-sectional views of the device 1900 along a plane substantially parallel to a plane defined by section AA' of FIG. 1B (perpendicular to the direction of the gate structure 158). The method 1800 is substantially the same as the method 200, discussed above, with the addition of one additional step inserted between the cut metal etch process (block 212) and the dielectric fill and CMP processes (block 214) of the method 200. Thus, for clarity of discussion, aspects of the method 1800 overlapping with the method 200 are only briefly mentioned, while focusing the discussion on the additional features presented by the method 1800.

The method 1800 begins at step 1802, which includes blocks 202-212 of the method 200. Thus, after the step 1802 of the method 1800 and with reference to FIGS. 19A/19B, the device 1900 is substantially the same as the device 300 illustrated in FIGS. 8A/8B, which shows the device 300 immediately after the cut metal etching process (block 212). As such, the device 1900 includes the recesses 802 that expose portions of the etched-back metal gate layer 314 as well as the etched-back sidewall spacer layers 316. In some embodiments, the device also includes the portion of the metal cap layer 502A that remains after the cut metal etching process (e.g., disposed between the recesses 802) and that defines a metal gate via for the device 1900, providing electrical connectivity to the underlying metal gate layer 314. As previously noted, while there may be a glue layer present between the metal gate layer 314 and the portion of the metal cap layer 502A, there is no glue layer present along sidewalls of the portion of the metal cap layer 502A.

Figure 19A:
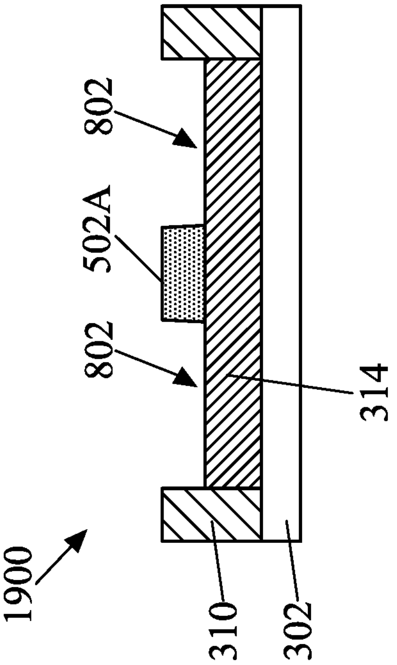
FIGS. 19A, 20A, and 21A provide cross-sectional views of a device at intermediate stages of fabrication and processed in accordance with the method of FIG. 18, along a plane substantially parallel to a plane defined by section BB' of FIG. 1B, according to some embodiments.
Figure 19B:
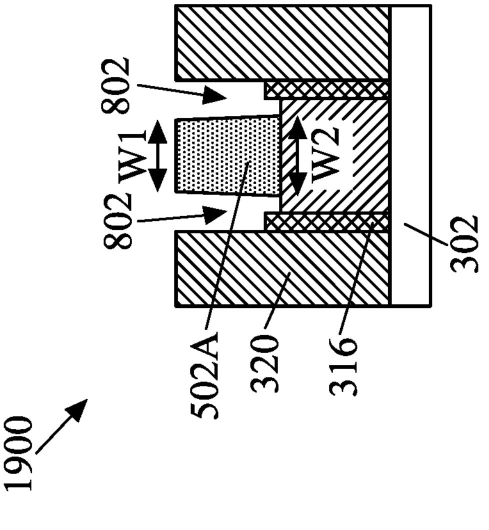
FIGS. 19B, 20B, and 21B provide cross-sectional views of a device at intermediate stages of fabrication and processed in accordance with the method of FIG. 18, along a plane substantially parallel to a plane defined by section AA' of FIG. 1B, according to some embodiments.

Instead of next performing the dielectric fill and CMP processes, as described in the method 200, the method 1800 proceeds to block 1804 where a selective metal deposition is performed. With reference to FIGS. 19A/19B and 20A/20B, and in an embodiment of block 1804, a metal layer 2002 is selectively deposited over metal regions including the portion of the metal cap layer 502A and the exposed portions of the etched-back metal gate layer 314 on either side of the portion of the metal cap layer 502A. The selectively deposited metal layer 2002 may also, in some embodiments, be conformally deposited over the metal regions. In various examples, however, the metal layer 2002 may not be deposited over dielectric layers, such as the etched-back sidewall spacer layers 316, the dielectric layer 310, and the dielectric layer 320. In some embodiments, the metal layer 2002 may include Co, W, Ru, Al, Mo, Ti, TiN, TiSi, CoSi, NiSi, Cu, TaN, or combinations thereof. In various examples, the metal layer 2002 may be deposited by PVD, CVD, ALD, e-beam evaporation, or other suitable process. In some examples, the metal layer 2002 may be used to further reduce the resistance of the metal gate via of the device 1900 (e.g., the portion of the metal cap layer 502A).

Figure 20A:
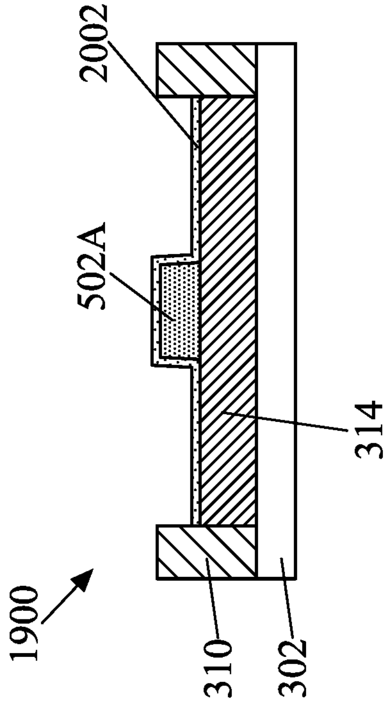
Figure 20B:
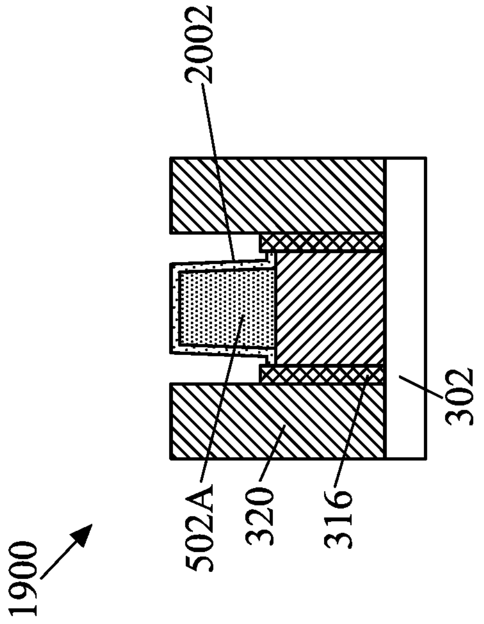
Figure 21A:
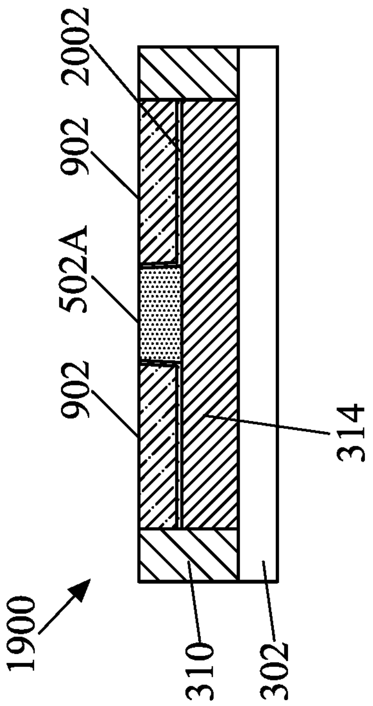
Figure 21B:
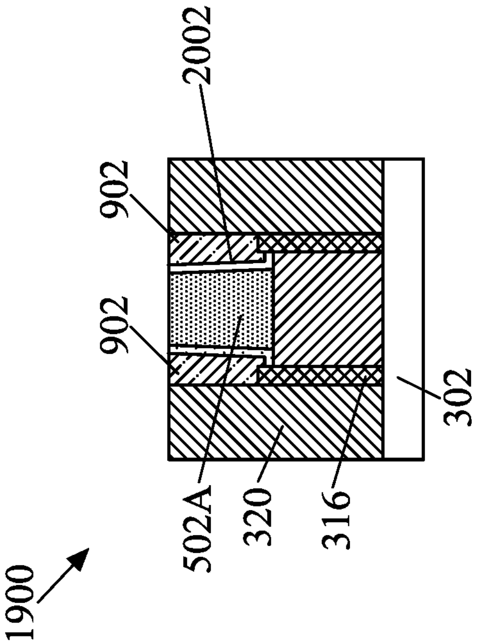

The method 1800 proceeds to block 1806 where dielectric fill and CMP processes are performed. With reference to FIGS. 20A/20B and 21A/21B, and in an embodiment of block 1806, the dielectric layer 902 is deposited over the device 1900 including within the recesses 802, over the selectively deposited metal layer 2002, and over the etched-back sidewall spacer layers 316. After deposition of the dielectric layer 902, and in some embodiments, a CMP process is performed to remove excess material and planarize the top surface of the device 1900. In some embodiments, the CMP process may remove the metal layer 2002 from a top surface of the metal cap layer portion 502A. The dielectric layer 902 may thus provide isolation features on either side of the metal cap layer portion 502A (e.g., the metal gate via of the device 1900). In various embodiments, the dielectric layer 902 may be substantially the same as described above with reference to block 214 of the method 200. In some embodiments, and after the dielectric fill and CMP processes of block 1806, top surfaces of the metal cap layer portion 502A, the metal layer 2002 disposed on sidewalls of the metal cap layer portion 502A, the dielectric layer 902, the dielectric layer 310, and the dielectric layer 320 may be substantially level (co-planar) with each other.

The device 1900 may undergo further processing to form various features and regions known in the art. For example, subsequent processing may form various contacts/vias/lines and multilayer interconnect features (e.g., metal layers and interlayer dielectrics) on the substrate 302, configured to connect the various features (e.g., including the metal gate via) to form a functional circuit that may include one or more devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1900, and some process steps described above may be replaced or eliminated in accordance with various embodiments of the method 1900.

Figure 22A:
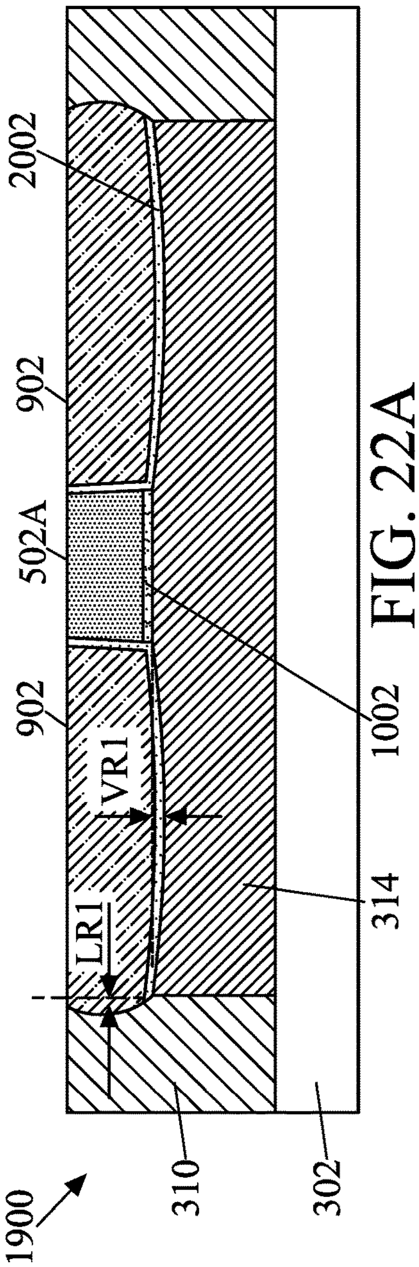
FIG. 22A provides an enlarged view of the device as shown in FIG. 21A, and FIG. 22B provides an enlarged view of the device as shown in FIG. 21B, in accordance with some embodiments.
Figure 22B:
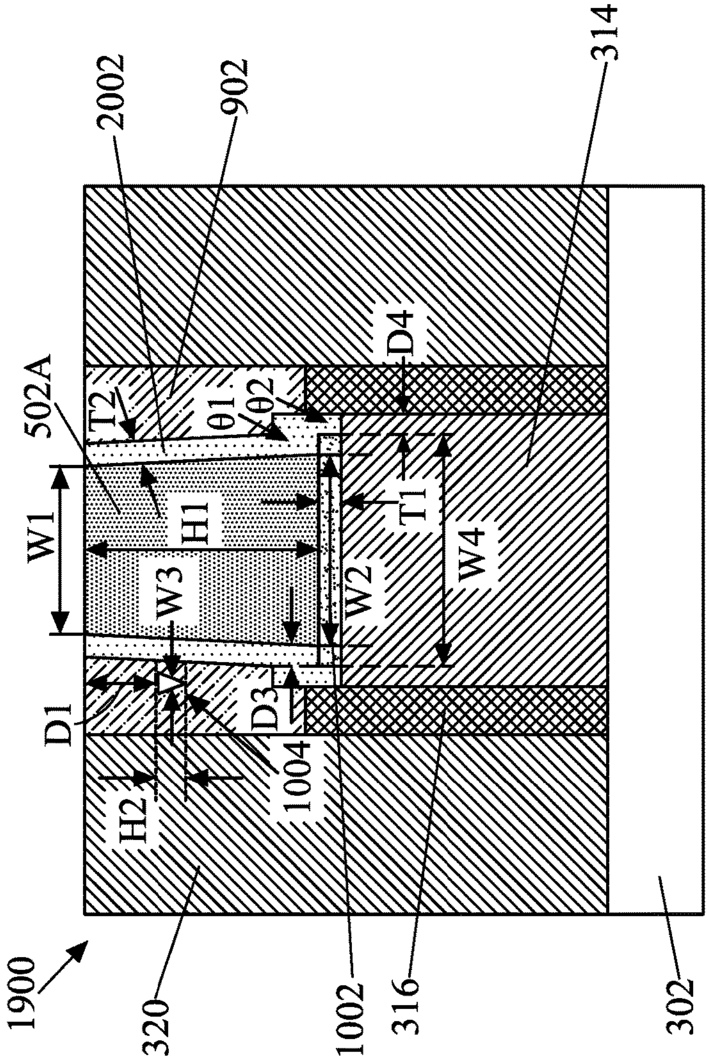

With reference to FIGS. 22A/22B, further details regarding the structure and dimensions of various features of the metal cap layer portion 502A (metal gate via), the selectively deposited metal layer 2002, and of the device 1900 including the metal gate via in general, are provided. In various embodiments, the device 1900 shown in FIG. 22A provides an enlarged view of the device 1900 shown in FIG. 21A, and the device 1900 shown in FIG. 22B provides an enlarged view of the device 1900 shown in FIG. 21B. However, FIGS. 22A/22B also illustrate the optional glue layer 1002, described above. FIG. 22A further illustrates the lateral recess 'LR1' and the vertical recess 'VR1', which may be substantially the same as discussed above. For example, in some embodiments, the lateral recess 'LR1' may be in a range of about 0.5 nm-30 nm, and the vertical recess 'VR1' may be in a range of about 0.5 nm-30 nm. In some cases, there may be no lateral recess 'LR1' or vertical recess 'VR1'.

FIG. 22B illustrates a plurality of features and dimensions that are substantially the same as features and dimensions discussed above with reference to FIG. 10B. For example, the void 1004 in the dielectric layer 902, if present, may be spaced a distance 'D1' from the top surface of the dielectric layer 902, where 'D1' may be in a range of about 1 nm-30 nm. The void 1004, if present, may also have a width dimension 'W3' in a range of about 0.5 nm-30 nm, and a height dimension 'H2' in a range of about 0.5 nm-30 nm. As previously noted, and regardless of whether voids (e.g., such as the void 1004) are present within the dielectric layer 902, embodiments of the present disclosure may effectively prevent the formation of voids within the metal gate via (e.g., the metal cap layer portion 502A). The metal cap layer 502 may have a height 'H1' in a range of about 0.5 nm-30 nm, as previously noted. In some embodiments, the top dimension 'W1' of the metal cap layer portion 502A is in a range of about 0.5 nm-30 nm, and the bottom dimension 'W2' of the metal cap layer portion 502A is in a range of about 0.5 nm-40 nm, as also previously noted. In some cases, an angle 'Θ1' is defined at a bottom of the metal cap layer portion 502A, where the angle 'Θ1' may be in a range of about 90 degrees-150 degrees. The glue layer 1002, if present, may have a thickness 'Ti' in a range of about 0.5 nm-30 nm. In addition, if present, the glue layer 1002 may extend beyond metal cap layer portion 502A by a distance 'D3' of about 10 nm. In addition, and in some embodiments, a dimension 'W4' of the glue layer 1002, if present, is in a range of about 0.5 nm-50 nm. In some cases, the dimension 'W4' may be substantially the same as the bottom dimension 'W2' of the metal cap layer portion 502A (e.g., as shown in FIG. 23). In embodiments including the glue layer 1002, a distance 'D4' may be defined between an end of the glue layer 1002 and an adjacent sidewall spacer layer 316, where the distance 'D4' is about 10 nm. In some embodiments, an angle 'Θ2' may also be defined at a bottom of the glue layer 1002, if present, where the angle 'Θ2' may be in a range of about 90 degrees-150 degrees. In addition, FIG. 22B illustrates the selectively deposited metal layer 2002 having a thickness 'T2' in a range of about 0.5 nm-30 nm.

Figure 24:
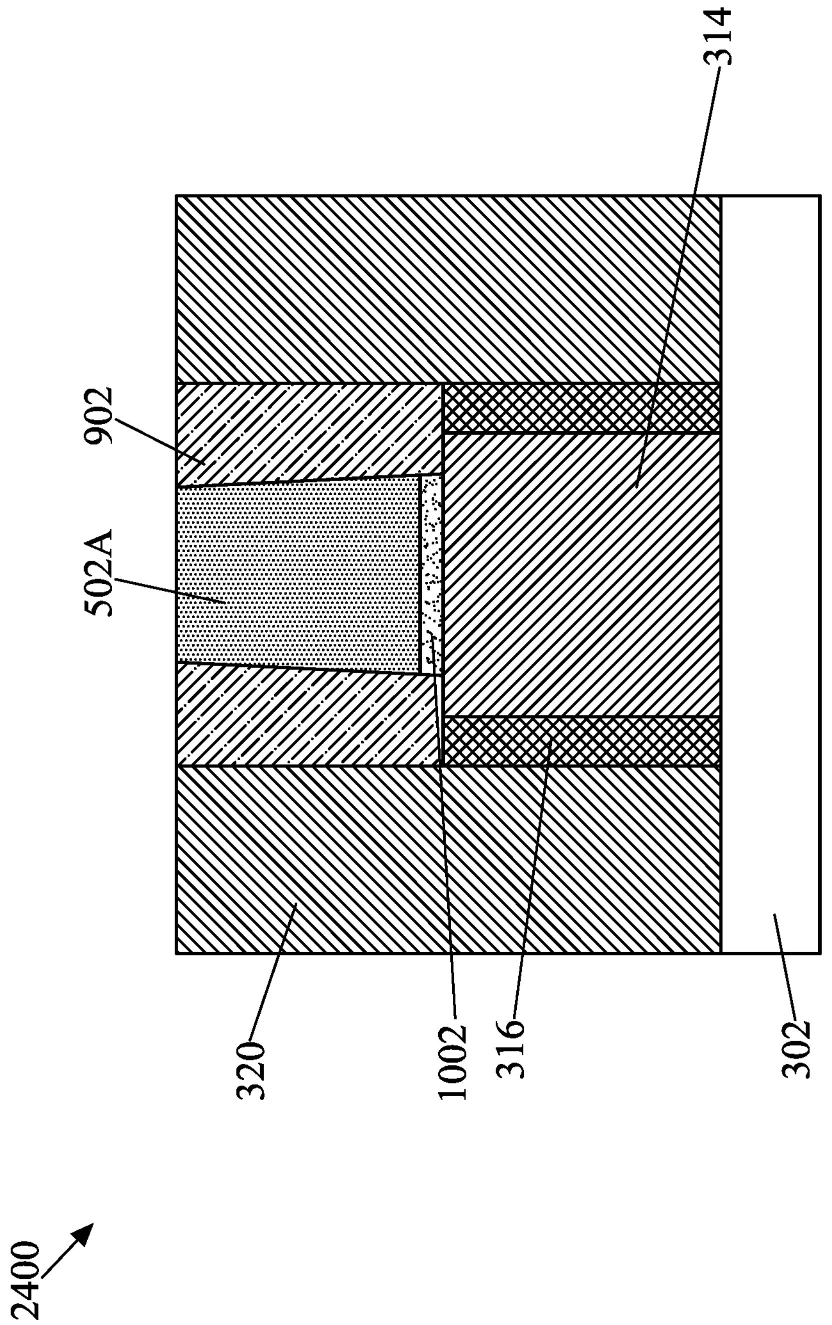

With reference to FIG. 24, illustrated therein is a device 2400, in accordance with some embodiments. In various examples, the device 2400 may be similar to the device 300 and may be fabricated in accordance with the method 200, discussed above. However, the device 2400 differs in that a top surface of the metal gate layer 314 is substantially level (co-planar) with a top surface of the sidewall spacer layers 316. In some embodiments, the co-planar top surfaces of the metal gate layer 314 and the sidewall spacer layers 316 may be formed during the etch-back process, for example, of block 204 of the method 200. In some cases, a similar etch-back process and formation of the co-planar top surfaces of the metal gate layer 314 and the sidewall spacer layers 316 may likewise be performed as part of the method 1800, for example, at step 1802 of the method 1800.

Figure 25:
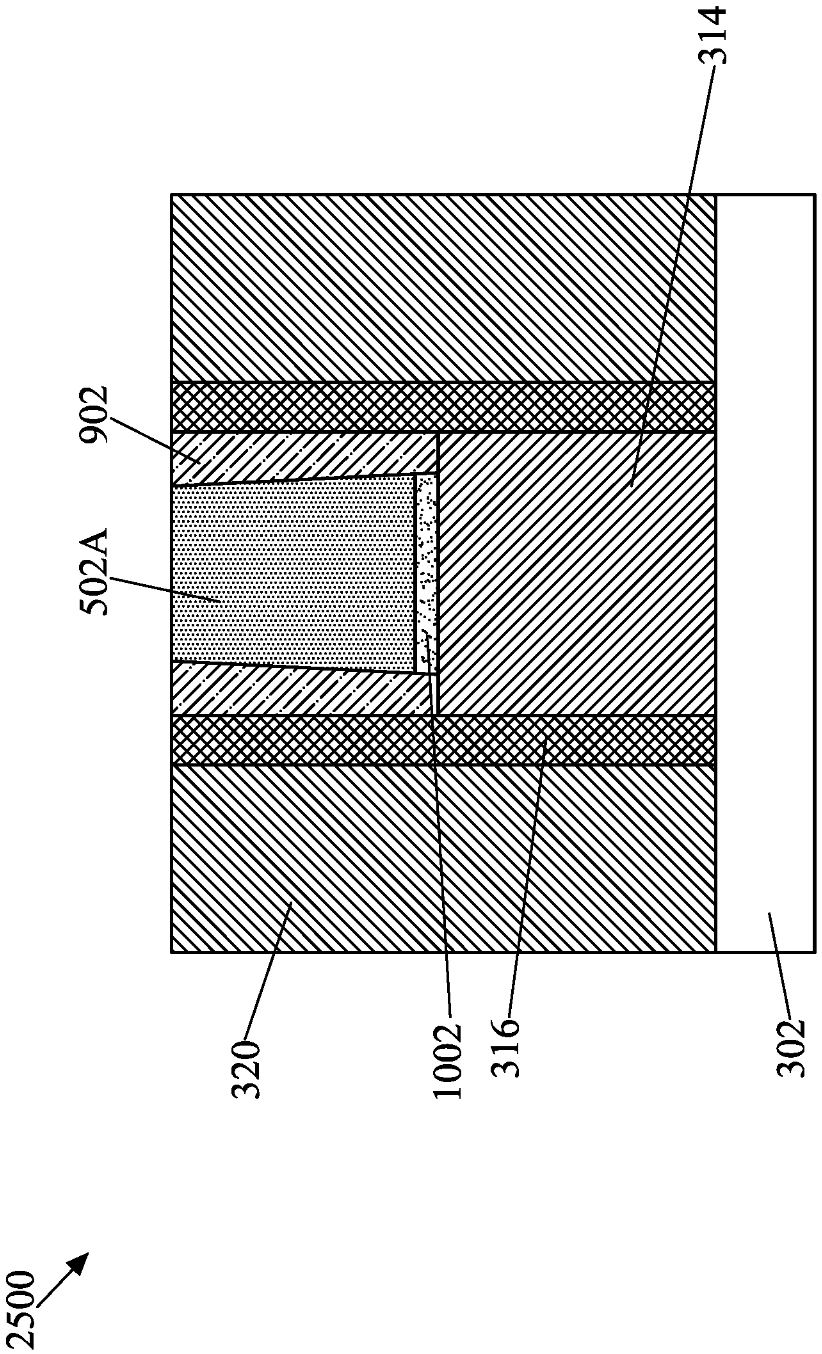

Referring to FIG. 25, illustrated therein is a device 2500, in accordance with some embodiments. In some examples, the device 2500 may be similar to the device 300 and may be fabricated in accordance with the method 200, discussed above. However, the device 2500 differs in that a top surface of the sidewall spacer layers 316 is substantially level (co-planar) with a top surface of the metal cap layer portion 502A, a top surface of the dielectric layer 902, and a top surface of the dielectric layer 320. Stated another way, the sidewall spacer layers 316 extends beyond a top surface of the metal gate layer 314, such that the top surface of the metal gate layer 314 is recessed with respect to the top surface of the sidewall spacer layers 316, or such that a plane defined by a top surface of the metal gate layer 314 is disposed beneath a plane defined by a top surface of the sidewall spacer layers 316. The sidewall spacer layers 316 of the device 2500 may be separated from the metal cap layer portion 502A by the dielectric layer 902. Further, the sidewall spacer layers 316 of the device 2500 may be disposed between the dielectric layer 902 and the dielectric layer 320 (e.g., the ILD layer), as shown. In some embodiments, fabrication of the device 2500 may include performing the etch-back process (block 204 of the method 200), where the etch-back process etches the metal gate layer 314 without substantial etching of the sidewall spacer layers 316. In some cases, a similar etch-back process and formation of the co-planar top surfaces of the sidewall spacer layers 316, the metal cap layer portion 502A, the dielectric layer 902, and the dielectric layer 320 may likewise be performed as part of the method 1800, for example, at step 1802 of the method 1800.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a fabrication process for contact structures including metal gate vias. In some embodiments, a cut metal method for the formation of metal gate vias, which are used to provide electrical contact to an underlying metal gate electrode, is disclosed. The disclosed cut metal method provides a tapered metal gate via structure having a smaller top dimension (e.g., width of the metal gate via at the top of the metal gate via) as compared to a larger bottom dimension (e.g., width of the metal gate via at the bottom of the metal gate via). Further, and in accordance with some embodiments, there is no glue layer along sidewalls of the metal gate via, providing much better device performance due to elimination of parasitic glue layer resistance. In some embodiments, the larger bottom dimension (e.g., provided by the tapered metal gate via structure) also provides a larger interfacial area between the metal gate via and an underlying metal gate electrode, resulting in a greatly reduced interface resistance and enhanced device performance (e.g., including enhanced device speed). The disclosed cut metal method also does not require etching to form a metal gate via opening and metal deposition (metal gap fill), thus avoiding challenges faces by at least some existing implementations. As a result, the disclosed cut metal method enables better process feasibility, especially for highly-scaled devices. Thus, embodiments of the present disclosure provide for reduced interface resistance between a metal gate via and an underlying metal gate electrode (e.g., by providing a larger contact area). Further, aspects of the present disclosure solve the serious metal gate via etching and metal gap fill issues associated with at least some conventional ultra-small metal gate via structures.

Thus, one of the embodiments of the present disclosure described a semiconductor device including a metal gate structure having sidewall spacers disposed on sidewalls of the metal gate structure. In some embodiments, a top surface of the metal gate structure is recessed with respect to a top surface of the sidewall spacers. The semiconductor device may further include a metal cap layer disposed over and in contact with the metal gate structure, where a first width of a bottom portion of the metal cap layer is greater than a second width of a top portion of the metal cap layer. In some embodiments, the semiconductor device may further include a dielectric material disposed on either side of the metal cap layer, where the sidewall spacers and a portion of the metal gate structure are disposed beneath the dielectric material.

In another of the embodiments, discussed is a semiconductor device including a metal gate structure having a top portion and a bottom portion. In some embodiments, the top portion of the metal gate structure has a tapered profile. By way of example, a bottom surface of the tapered profile has a greater width than a top surface of the tapered profile. In some cases, the bottom surface of the tapered profile has a lesser width than a top surface of the bottom portion of the metal gate structure. The semiconductor device may further includes sidewall spacers disposed on sidewalls of the metal gate structure, where the sidewall spacers contact the bottom portion of the metal gate structure. In some embodiments, the sidewall spacers are separated from the top portion of the metal gate structure by a dielectric material. In some cases, part of the bottom portion of the metal gate structure is disposed beneath the dielectric material.

In yet another of the embodiments, discussed is a method of fabricating a semiconductor device that includes providing a substrate having a metal gate structure with sidewall spacers disposed on sidewalls of the metal gate structure. In some embodiments, the method further includes etching-back the metal gate structure and the sidewall spacers, where a top surface of the metal gate structure is recessed with respect to a top surface of the sidewall spacers after the etching-back. In some examples, the method further includes depositing a metal cap layer over the etched-back metal gate structure and the etched-back sidewall spacers. In various embodiments, the method further includes patterning the metal cap layer by removing portions of the metal cap layer to expose the etched-back sidewall spacers and at least part of the etched-back metal gate structure. In some embodiments, the patterned metal cap layer provides a metal gate via, and a first width of a bottom portion of the patterned metal cap layer is greater than a second width of a top portion of the patterned metal cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

etching-back a metal gate structure, wherein a top surface of the metal gate structure is recessed with respect to a top surface of an adjacent inter-layer dielectric (ILD) layer after the etching-back; and forming a patterned metal cap layer over the etched-back metal gate structure, wherein the patterned metal cap layer has a tapered profile and provides a metal gate via, and wherein a top surface of the metal gate via is substantially level with the top surface of the ILD layer;

wherein the tapered profile is free of a glue layer; and wherein a first width of a bottom portion of the metal gate via is greater than a second width of a top portion of the metal gate via.

2. The method of claim 1, further comprising:

forming a dielectric material on either side of the metal gate via and between the metal gate via and respective portions of the ILD layer.

3. The method of claim 1, further comprising:

forming sidewall spacers interposing the etched-back metal gate structure and the ILD layer, wherein a top surface of the sidewall spacers is recessed with respect to the top surface of the ILD layer.

4. A method of fabricating a semiconductor device, comprising:

providing a substrate including a metal gate structure having sidewall spacers disposed on sidewalls of the metal gate structure;

etching-back the metal gate structure and the sidewall spacers, wherein a top surface of the metal gate structure is recessed with respect to a top surface of the sidewall spacers after the etching-back;

depositing a metal cap layer over the etched-back metal gate structure and the etched-back sidewall spacers; and patterning the metal cap layer by removing portions of the metal cap layer to expose the etched-back sidewall spacers and at least part of the etched-back metal gate structure;

wherein the patterned metal cap layer provides a metal gate via, and wherein a first width of a bottom portion of the patterned metal cap layer is greater than a second width of a top portion of the patterned metal cap layer.

5. The method of claim 4, further comprising:

forming a dielectric material on either side of the patterned metal cap layer and over the exposed etched-back sidewall spacers and the at least part of the etched-back metal gate structure.

6. The method of claim 4, further comprising:

selectively depositing a metal layer on top and sidewall surfaces of the patterned metal cap layer and on an exposed surface of the at least part of the etched-back metal gate structure; and forming a dielectric material on either side of the patterned metal cap layer, over the selectively deposited metal layer, and over the exposed etched-back sidewall spacers.

7. The method of claim 4, wherein the patterning the metal cap layer includes forming the patterned metal cap layer with a tapered sidewall profile, and wherein the tapered sidewall profile is free of a glue layer.

8. The method of claim 4, wherein the patterning the metal cap layer includes forming a hard mask layer over the metal cap layer, forming a patterned resist layer over the hard mask layer, and etching portions of the hard mask layer and the portions of the metal cap layer to expose the etched-back sidewall spacers and the at least part of the etched-back metal gate structure.

9. The method of claim 4, further comprising:

prior to etching-back the metal gate structure and the sidewall spacers, forming an inter-layer dielectric (ILD) layer disposed adjacent to the metal gate structure, wherein a first lateral surface of the ILD layer contacts a second lateral surface of a sidewall spacer that is disposed on a sidewall of the metal gate structure.

10. The method of claim 9, wherein after etching-back the metal gate structure and the sidewall spacers, the top surface of the metal gate structure and the top surface of the sidewall spacers are both recessed with respect to a top surface of the ILD layer.

11. The method of claim 9, wherein top surfaces of the metal cap layer and the ILD layer are substantially level with each other.

12. A method of fabricating a semiconductor device, comprising:

forming a metal gate via over a metal gate layer, wherein the metal gate via has a tapered sidewall profile;

forming sidewall spacers disposed on sidewalls of the metal gate layer; and forming a dielectric material interposing the sidewall spacers and the metal gate via, wherein the dielectric material at least partially interfaces a top surface of the metal gate layer;

wherein a bottom surface of the metal gate via has a larger width than a top surface of the metal gate via, and wherein the bottom surface of the metal gate via has a smaller width than the top surface of the metal gate layer.

13. The method of claim 12, wherein the tapered sidewall profile is free of a glue layer.

14. The method of claim 12, further comprising:

performing a cut metal gate process to provide a dielectric layer that isolates the metal gate layer of the semiconductor device from another metal gate layer of an adjacent semiconductor device.

15. The method of claim 12, wherein the forming the metal gate via comprises:

etching-back the metal gate layer and the sidewall spacers;

depositing a metal cap layer over the etched-back metal gate layer and the etched-back sidewall spacers; and patterning the metal cap layer to define the metal gate via.

16. The method of claim 15, wherein the patterning the metal cap layer exposes the etched-back sidewall spacers and at least part of the etched-back metal gate layer.

17. The method of claim 12, wherein the top surface of the metal gate layer is recessed with respect to a top surface of the sidewall spacers.

18. The method of claim 17, wherein the top surface of the sidewall spacers is recessed with respect to the top surface of the metal gate via.

19. The method of claim 12, further comprising:

prior to forming the metal gate via, forming an inter-layer dielectric (ILD) layer disposed adjacent to the metal gate layer, wherein a lateral surface of the ILD layer interfaces with a lateral surface of the sidewall spacers.

20. The method of claim 19, wherein after forming the dielectric material interposing the sidewall spacers and the metal gate via, top surfaces of the metal gate via, the dielectric material, and the ILD layer are substantially level with each other.

* * * * *